United States Patent
Chen

(10) Patent No.: US 7,378,995 B2
(45) Date of Patent: *May 27, 2008

(54) LOW-COMPLEXITY SAMPLING RATE CONVERSION METHOD AND APPARATUS FOR AUDIO PROCESSING

(75) Inventor: Juin-Hwey Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/586,669

(22) Filed: Oct. 26, 2006

(65) Prior Publication Data

US 2007/0040713 A1    Feb. 22, 2007

Related U.S. Application Data

(63) Continuation of application No. 10/768,060, filed on Feb. 2, 2004, now Pat. No. 7,180,435.

(51) Int. Cl.
*H03M 7/00* (2006.01)

(52) U.S. Cl. .......................................... 341/61; 341/65

(58) Field of Classification Search ............. 341/50–90
See application file for complete search history.

(56) References Cited

U.S. PATENT DOCUMENTS

| 5,657,261 | A | 8/1997 | Wilson et al. |
|---|---|---|---|
| 5,748,120 | A | 5/1998 | Yasuda |
| 5,748,126 | A | 5/1998 | Ma et al. |
| 5,892,694 | A | 4/1999 | Ott |
| 6,084,916 | A | 7/2000 | Ott |
| 6,208,671 | B1 * | 3/2001 | Paulos et al. .................. 341/61 |
| 6,236,283 | B1 * | 5/2001 | Koslov ....................... 375/308 |
| 6,509,850 | B1 | 1/2003 | Bland |
| 6,512,468 | B1 * | 1/2003 | Zhong .......................... 341/61 |
| 6,546,407 | B2 | 4/2003 | Jiang et al. |
| 6,631,341 | B2 | 10/2003 | Kameda et al. |
| 6,747,858 | B1 | 6/2004 | Sculley et al. |
| 6,751,177 | B1 | 6/2004 | Abe et al. |
| 7,126,505 | B2 * | 10/2006 | Avantaggiati ................. 341/61 |
| 7,146,316 | B2 * | 12/2006 | Alves .......................... 704/233 |
| 2003/0161486 | A1 | 8/2003 | Wu et al. |
| 2004/0120361 | A1 | 6/2004 | Yu et al. |

\* cited by examiner

*Primary Examiner*—Lam T. Mai
(74) *Attorney, Agent, or Firm*—Sterne, Kessler, Goldstein and Fox P.L.L.C.

(57) ABSTRACT

A low-complexity sampling rate conversion (SRC) method and apparatus for the processing of digital audio signals. A first stage upsamples an input audio signal to generate an upsampled audio signal. For example, the first stage may perform 1:2 upsampling using a halfband filter. A second stage re-samples the upsampled audio signal from the first stage at a target sampling rate. For example, re-sampling may be achieved using linear interpolation.

45 Claims, 21 Drawing Sheets

LOW-COMPLEXITY SAMPLING RATE CONVERSION METHOD AND APPARATUS FOR AUDIO PROCESSING

CROSS-REFERENCE TO RELATED APPLICATION

This application is a continuation of U.S. patent application Ser. No. 10/768,060, filed Feb. 2, 2004, now U.S. Pat. No. 7,180,435.

BACKGROUND OF THE INVENTION

1. Field of the Invention

The present invention is generally directed to the processing of audio signals. In particular, the present invention is directed to sampling rate conversion (SRC) of audio signals.

2. Background Art

In some conventional audio processors, sampling rate conversion (SRC) is achieved by using a simple linear interpolation algorithm implemented in dedicated hardware. Conceptually, this algorithm is equivalent to drawing a straight line between each pair of adjacent samples of an input digital audio signal to approximate an underlying continuous-time analog signal, and then re-sampling the resulting piecewise-linear signal at a target output sampling rate. Although this algorithm has a very low complexity and is quite simple to implement, it suffers from poor audio quality, especially when upsampling from a very low sampling rate such as 8 kHz, to a much higher sampling rate such as 48 kHz. There is a very loud "image" distortion in the output of such a system.

Improved audio quality can be achieved by implementing known SRC methods that require high computational complexity, large memory size, or both. However, the use of such methods may be impossible in a system having limited processing resources and/or silicon area. For example, a typical DSP-textbook approach to SRC is to upsample an input audio signal by an integer factor of L, then downsample by an integer factor of M, in order to achieve an output sampling rate that is L/M times the input sampling rate. However, this approach results in unacceptably high complexity if one tries to convert, for example, 8 kHz to 44.1 kHz, because the simplest ratio of integers would be 441/80 in this case. Other conventional SRC algorithms can provide a significant improvement as compared to linear interpolation, but still produce audible image distortion and are also fairly complex.

What is desired, then, is a low-complexity SRC algorithm that provides a significant improvement in audio quality as compared to known low-complexity approaches, such as simple linear interpolation. The desired SRC algorithm should be simple to implement in hardware, requiring relatively few gates and thus permitting a reduced silicon area.

BRIEF SUMMARY OF THE INVENTION

The present invention is directed to a low-complexity sampling rate conversion (SRC) method and apparatus for the processing of audio signals. A low-complexity SRC method and apparatus in accordance with the present invention is extremely simple to implement, but nevertheless provides significantly higher quality audio output as compared to conventional low-complexity approaches, such as simple single-stage linear interpolation.

In accordance with an embodiment of the invention, a two-stage SRC algorithm is used. A first stage upsamples an input audio signal and a second stage re-samples the upsampled audio signal at the target output sampling rate using linear interpolation. In a particular embodiment, the first stage upsamples the audio signal by a factor of two using zero-padding followed by halfband filtering.

An algorithm in accordance with an embodiment of the present invention has very low complexity, and the same algorithm and the resulting fixed hardware configuration can be used for both upsampling and downsampling operations, thus eliminating the need to use two different algorithms and thus two separate silicon areas for upsampling and downsampling. Furthermore, this algorithm can advantageously be implemented using an existing linear interpolator design by adding a simple halfband filtering operation to implement the algorithm.

In an alternative embodiment of the invention, a two-stage SRC algorithm is used in which 1:3 upsampling with third-band filtering is used in the first stage followed by re-sampling using linear interpolation at a target sampling rate in the second stage. For example, 1:2 upsampling with linear interpolation may be used in the second stage. In a further alternative embodiment, a high quality filter having high stop-band attenuation, such as a high quality low pass filter, is used instead of the third-band filter in the first stage of the two-stage SRC algorithm to substantially eliminate stop-band leakage. In still further embodiments of the present invention, quadratic, cubic or spline interpolation are used instead of linear interpolation in the second stage of the two-stage SRC algorithm.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 3:
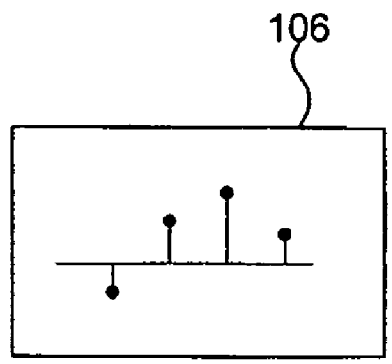
Figure 3:
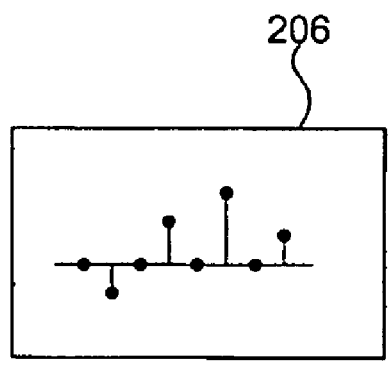
Figure 3:
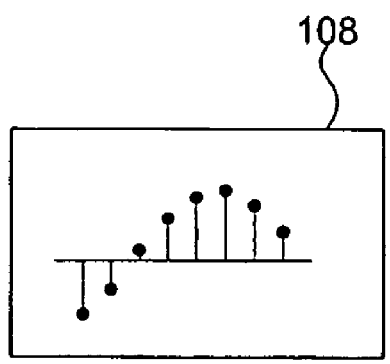

FIG. 3 graphically illustrates digital signals processed by a first stage of a two-stage SRC algorithm in accordance with an embodiment of the present invention.

Figure 4:
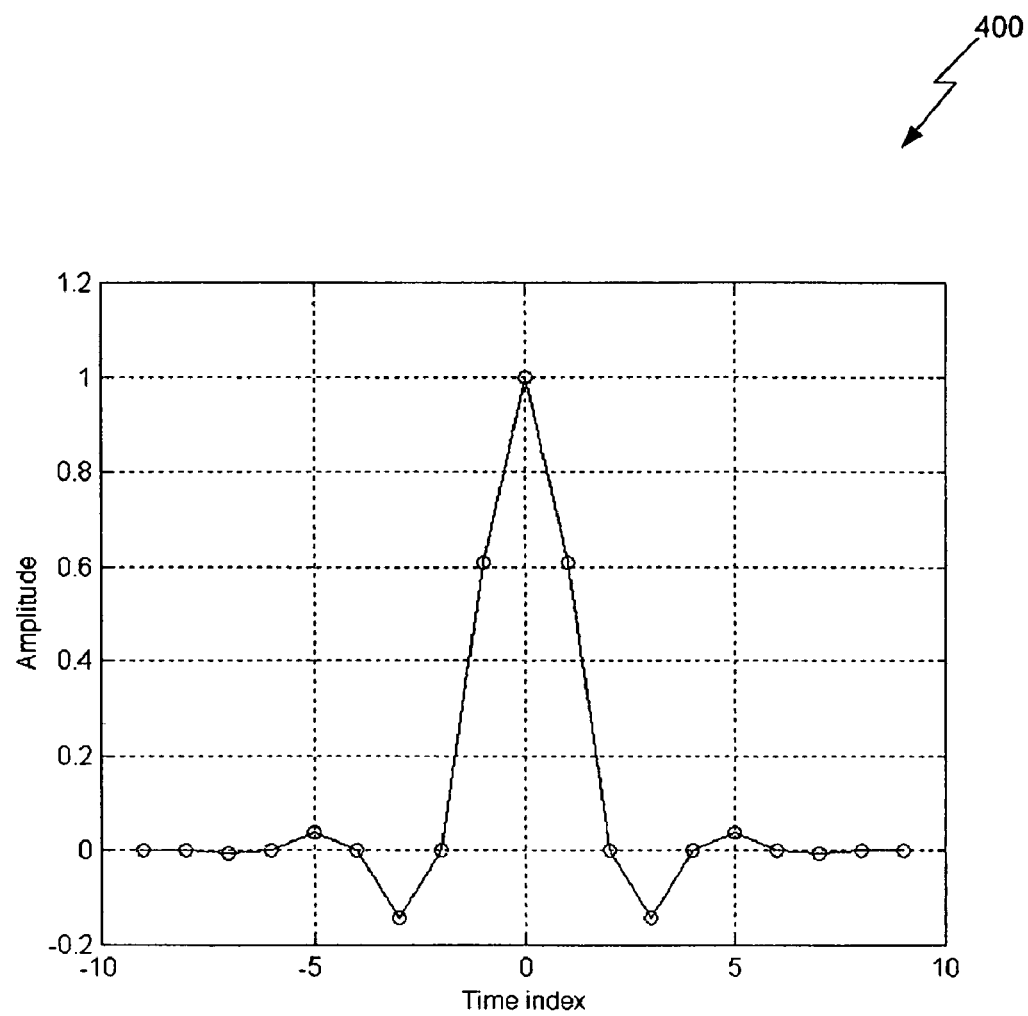

FIG. 4 is a graph illustrating the impulse response of a halfband filter used in accordance with an embodiment of the present invention.

Figure 5:
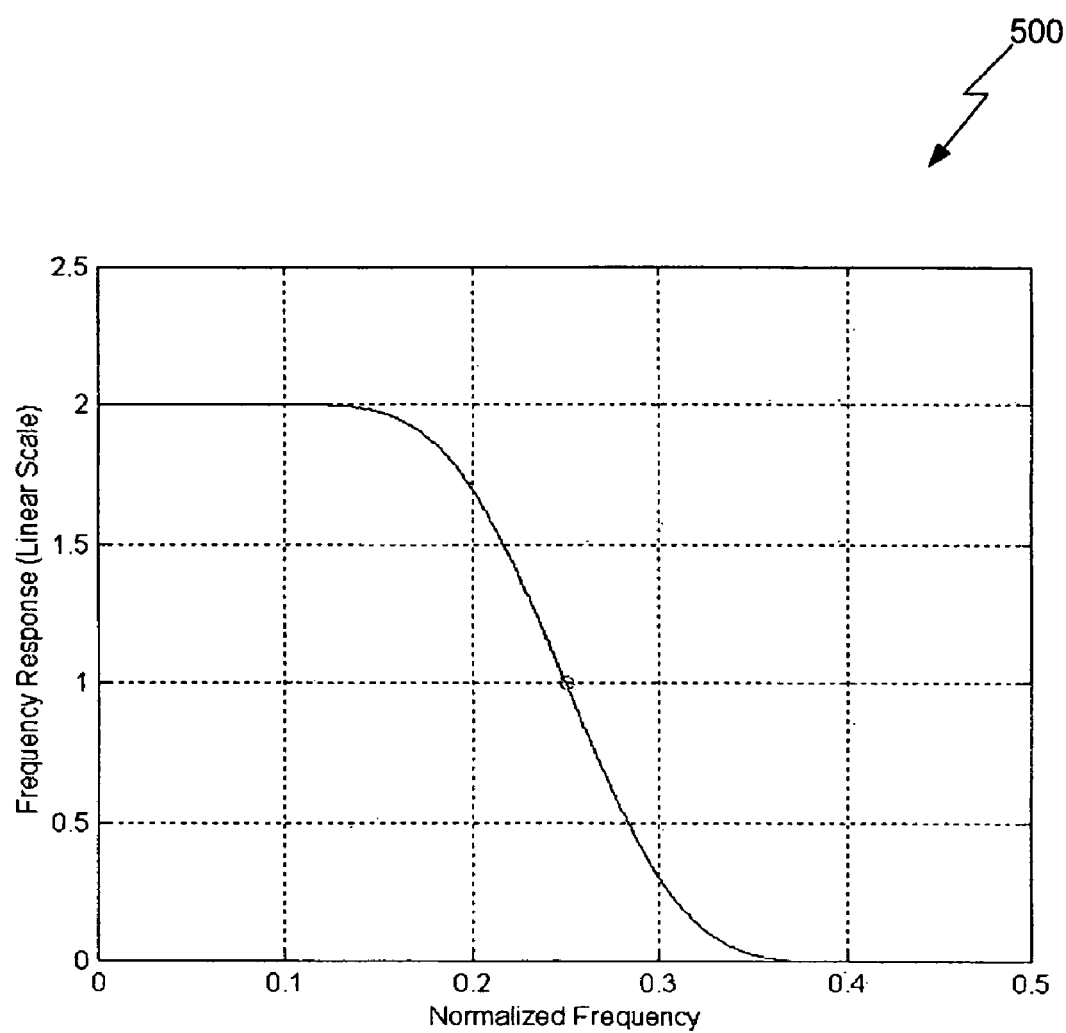

FIG. 5 is a graph illustrating the frequency response, in linear scale, of a halfband filter used in accordance with an embodiment of the present invention.

Figure 6:
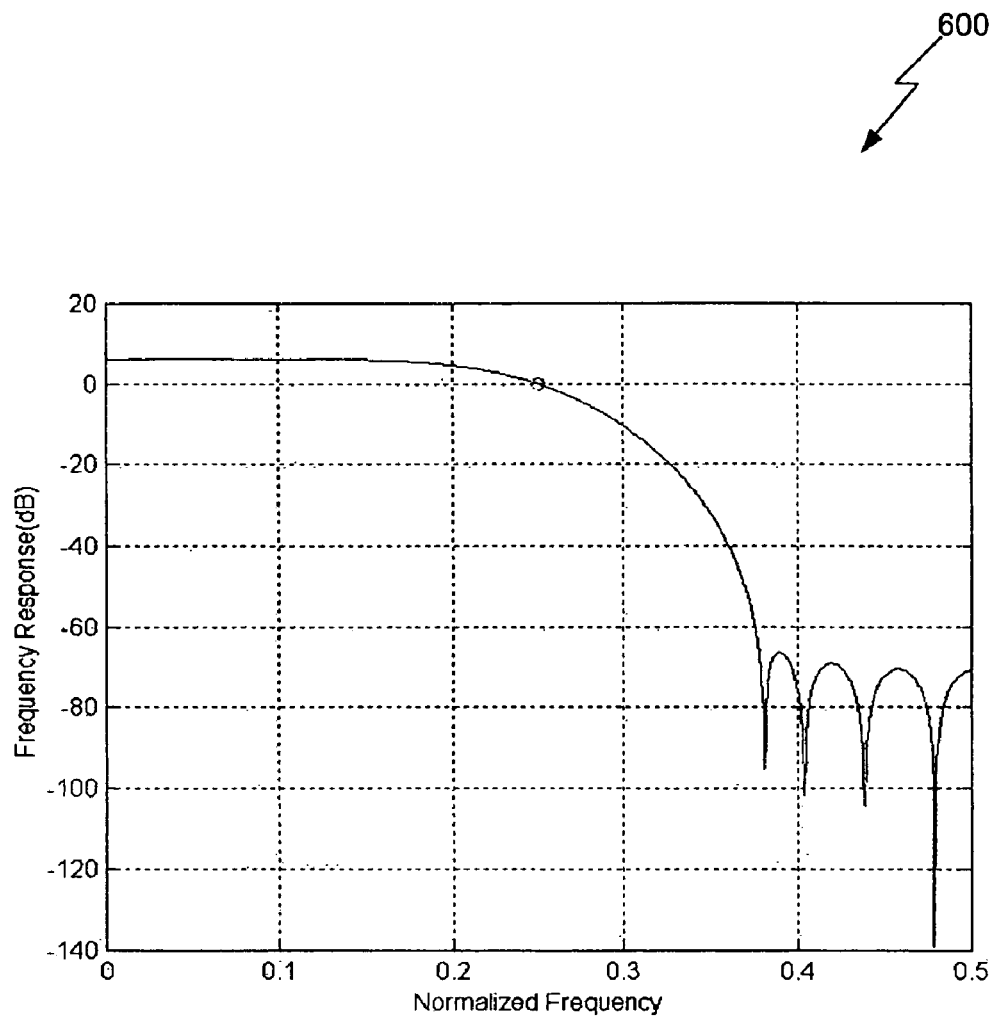

FIG. 6 is a graph illustrating the frequency response, in logarithmic scale, of a halfband filter used in accordance with an embodiment of the present invention.

Figure 7:
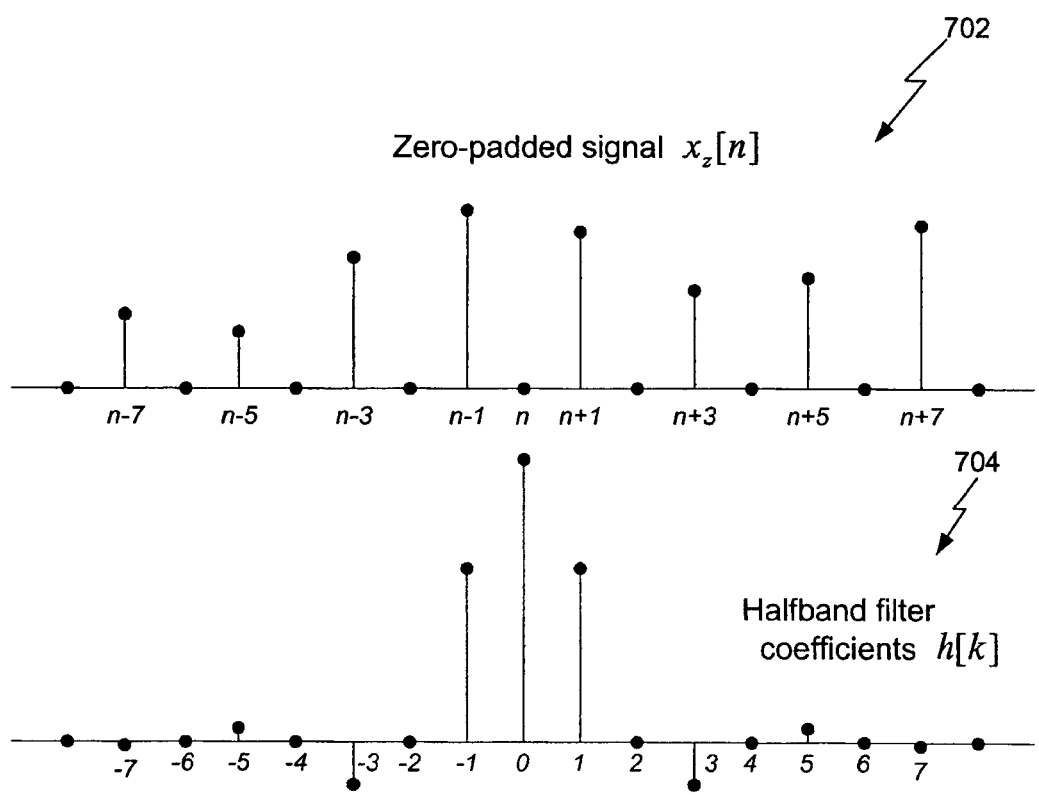

FIG. 7 illustrates the alignment of a zero-padded signal and halfband filter coefficients when filtering an inserted zero sample in accordance with an embodiment of the present invention.

Figure 8:
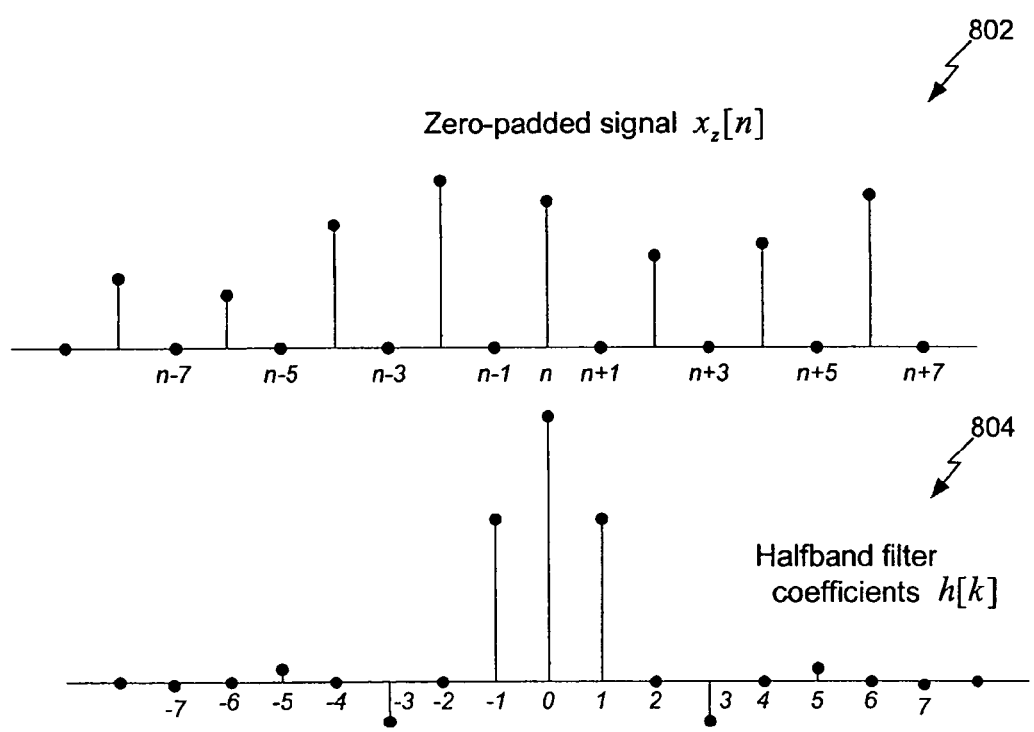

FIG. 8 illustrates the alignment of a zero-padded signal and halfband filter coefficients when filtering an original input sample in accordance with an embodiment of the present invention.

Figure 9:
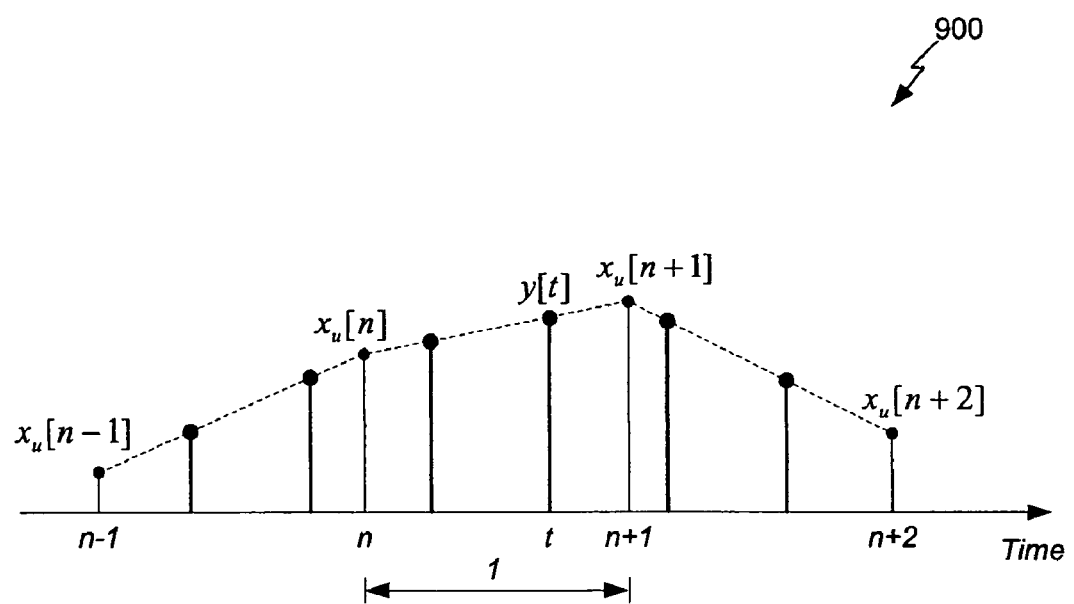

FIG. 9 is a graph illustrating linear interpolation between adjacent samples of a first-stage output signal in a two-stage SRC algorithm in accordance with an embodiment of the present invention.

Figure 10:
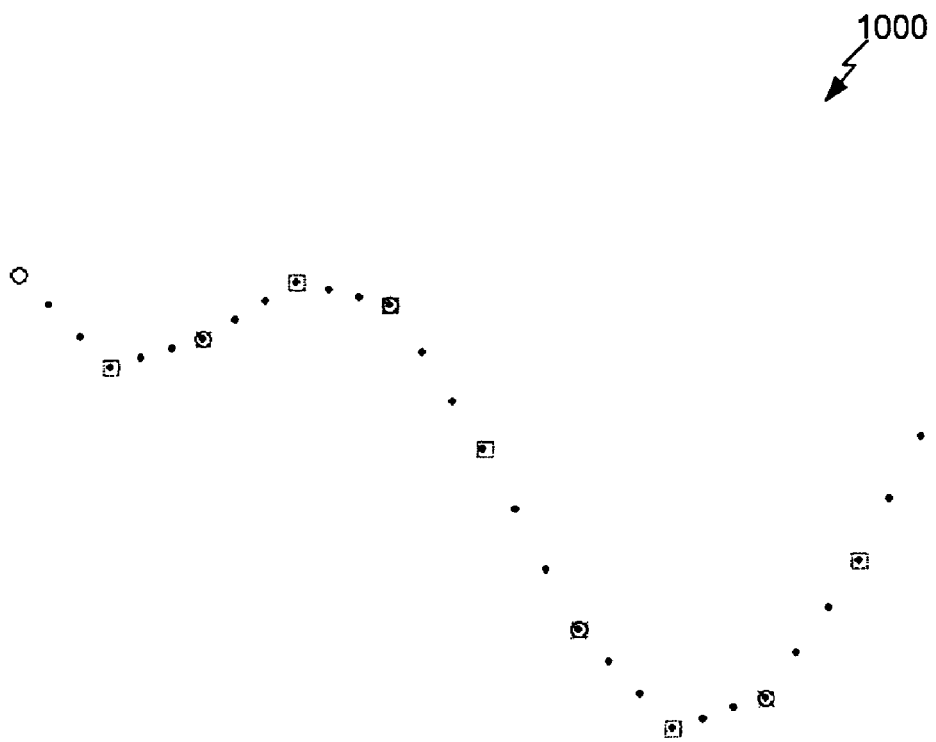
Figure 11:
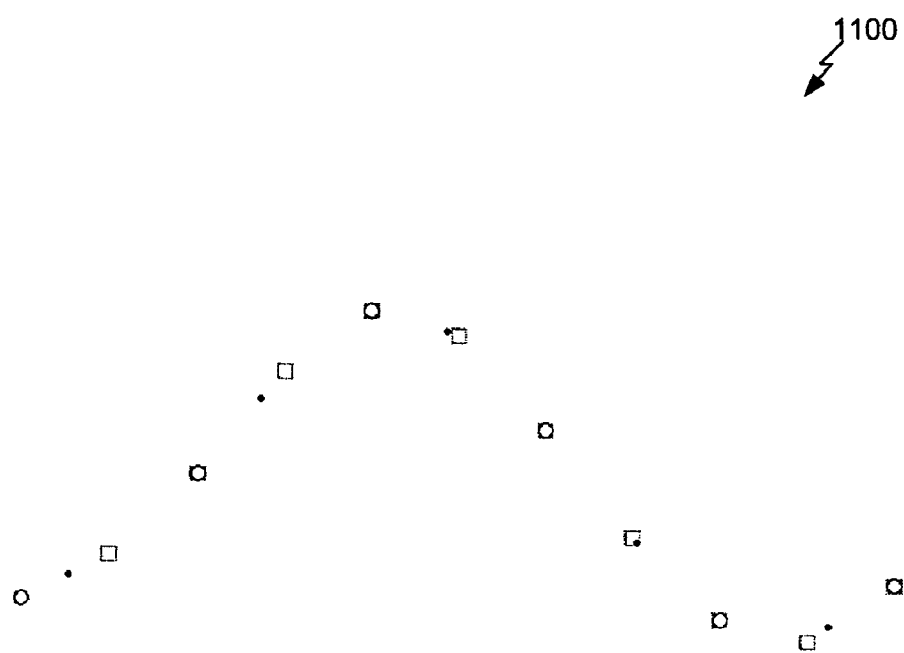

FIGS. 10 and 11 provide examples, respectively, of time-domain waveform samples of an input signal, a 1:2 upsampled signal, and a final SRC output signal in accordance with embodiments of the present invention.

Figure 12:
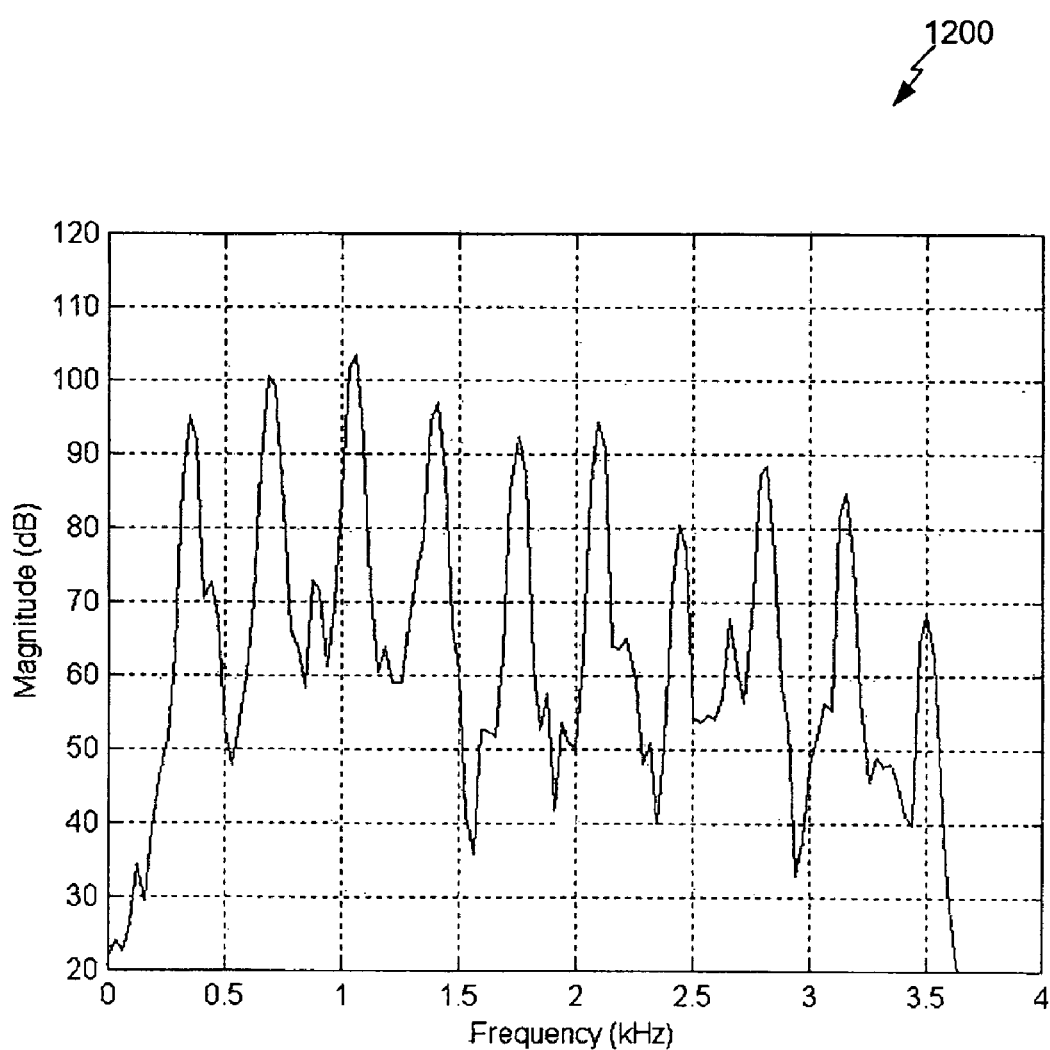

FIG. 12 is a graph of the spectrum of an 8 kHz-sampled input audio signal for an SRC algorithm in accordance with an embodiment of the present invention.

Figure 13:
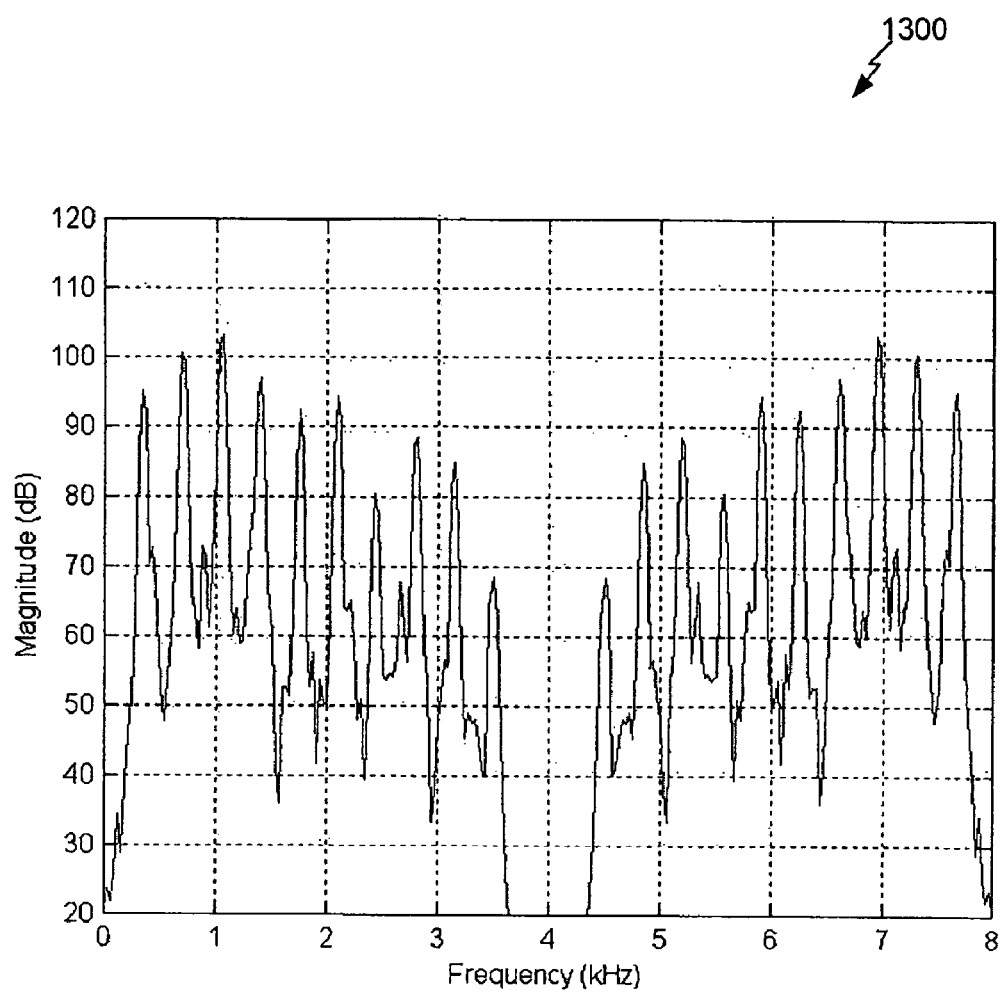

FIG. 13 is a graph of the spectrum of a 16 kHz 1:2 zero-padded signal generated by an SRC algorithm in accordance with an embodiment of the present invention.

Figure 14:
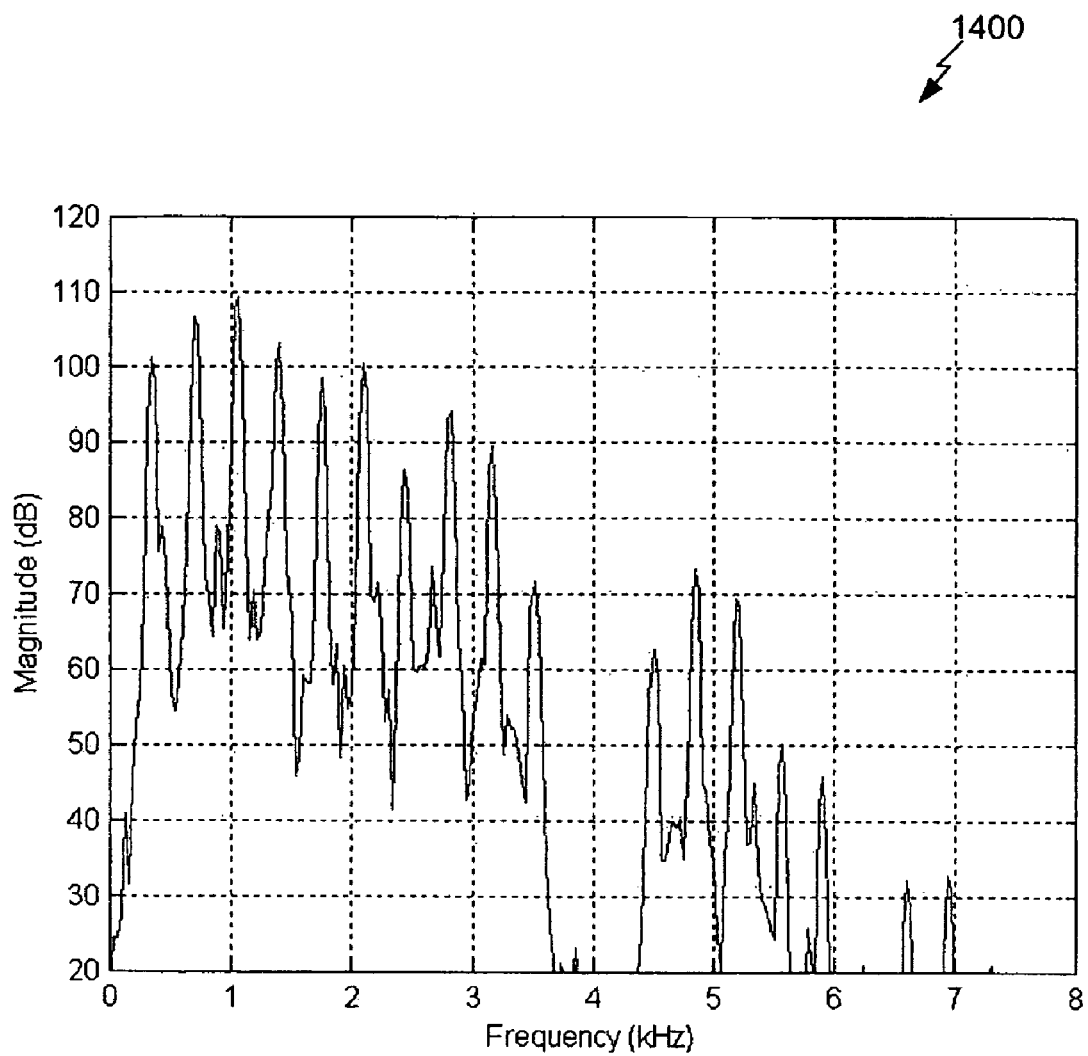

FIG. 14 is a graph of the spectrum of a 1:2 upsampled signal generated by an SRC algorithm in accordance with an embodiment of the present invention.

Figure 15:
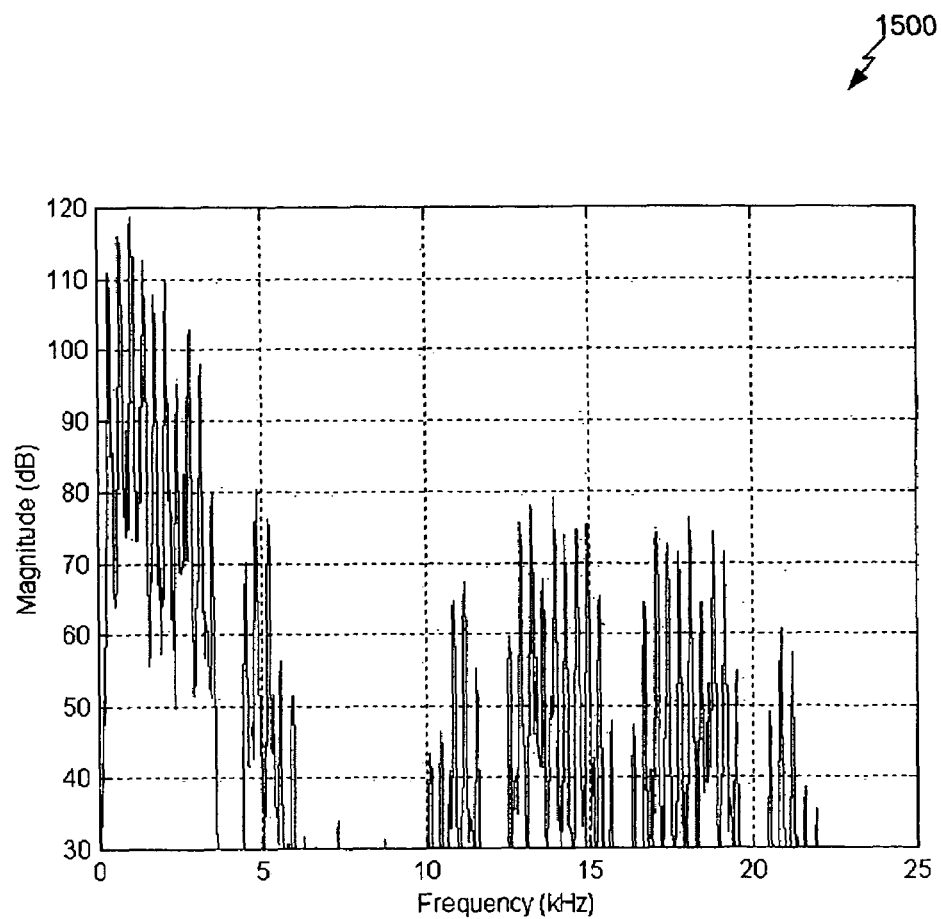

FIG. 15 is a graph of the spectrum of a final 48 kHz SRC output signal generated by an SRC algorithm in accordance with an embodiment of the present invention.

Figure 16:
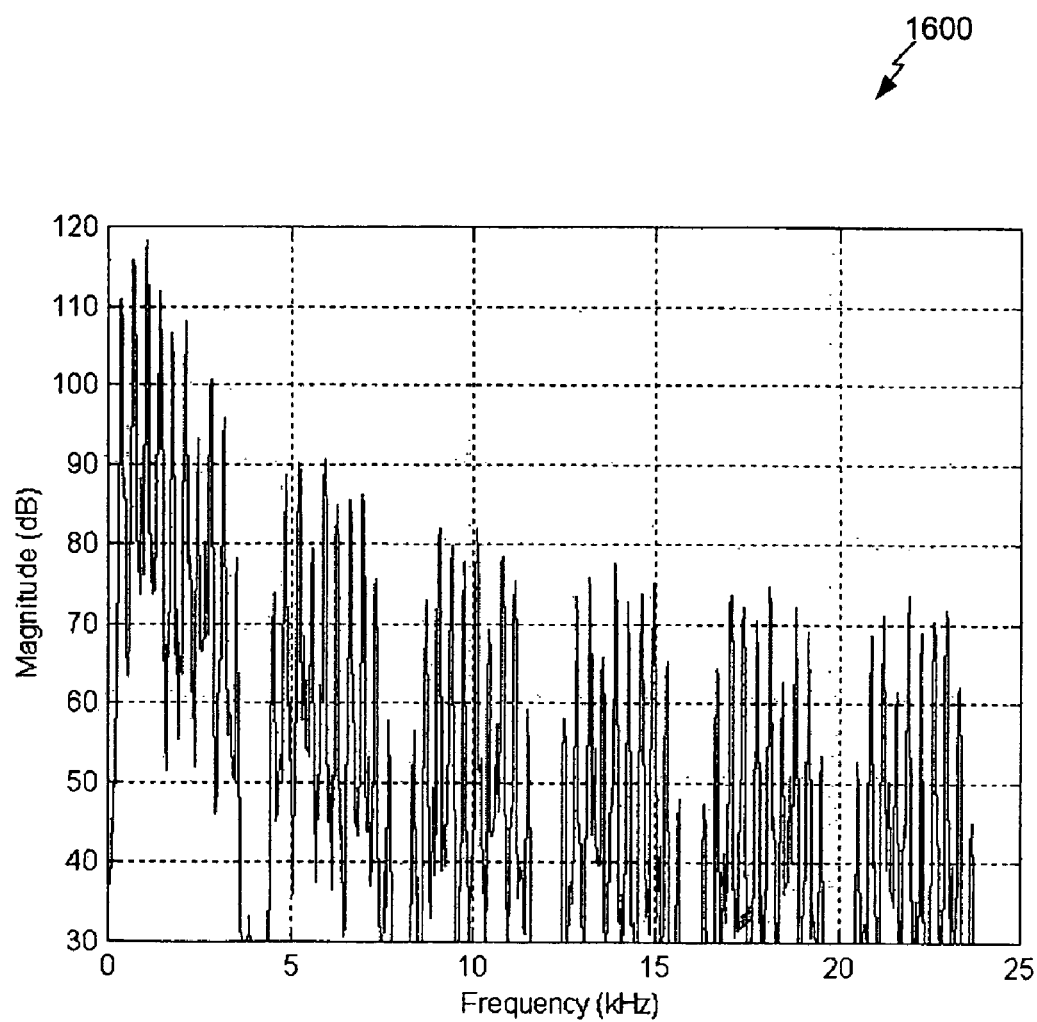

FIG. 16 is a graph of the spectrum of an SRC output signal when conventional linear interpolation is used to perform single-stage 1:6 upsampling.

Figure 17:
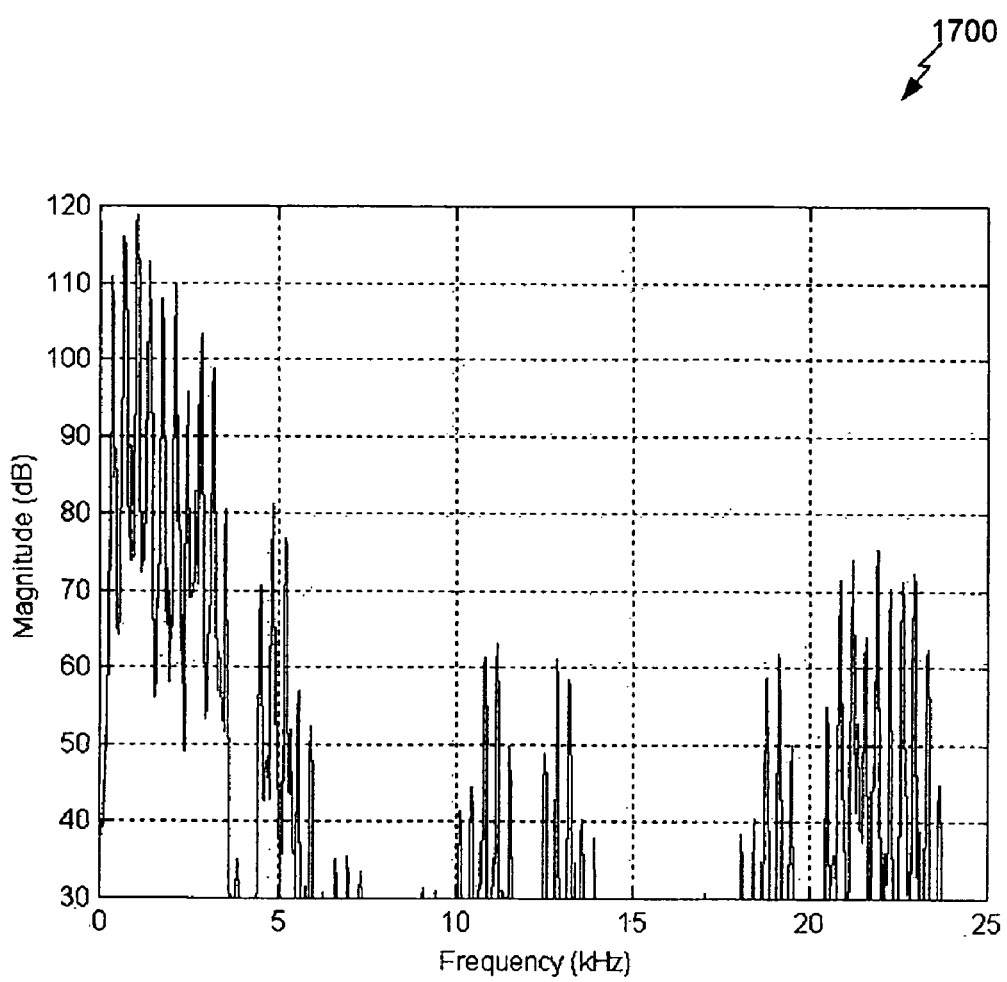

FIG. 17 is a graph of the spectrum of an SRC output signal of an alternative implementation of a two-stage SRC algorithm in accordance with the present invention.

Figure 18:
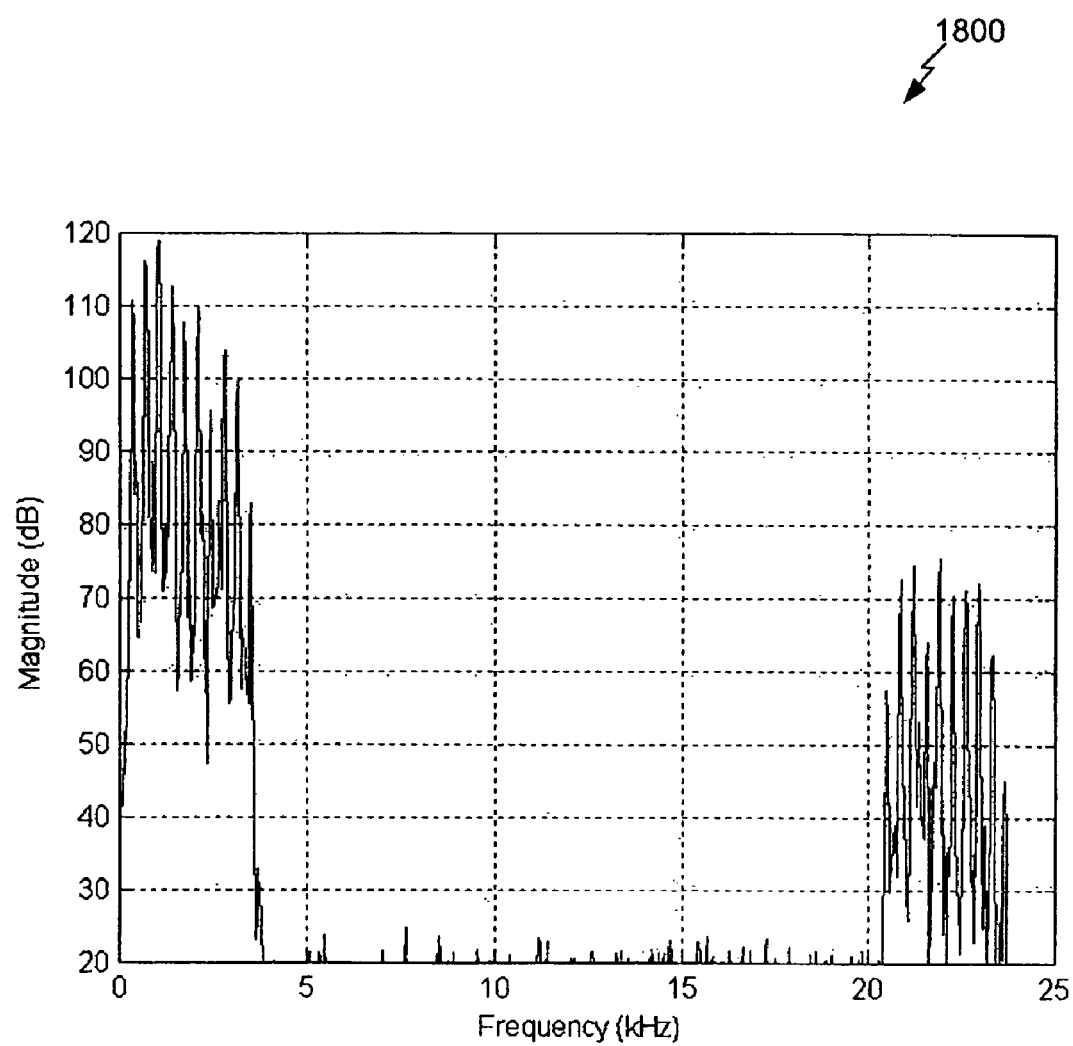

FIG. 18 is a graph of the spectrum of an SRC output signal of yet another alternative implementation of a two-stage SRC algorithm in accordance with the present invention.

Figure 19:
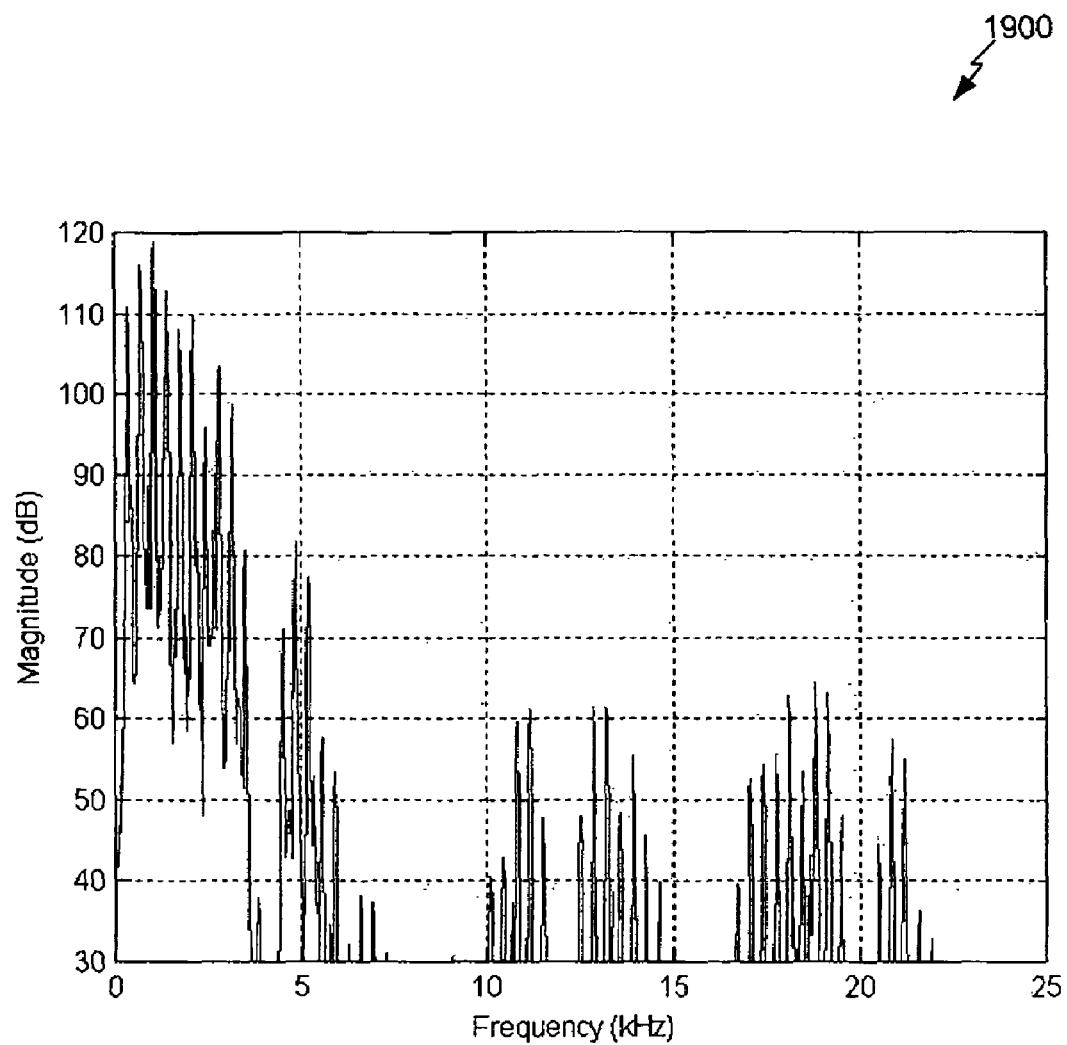

FIG. 19 is a graph that shows the output signal spectrum for a two-stage SRC algorithm using averaged quadratic interpolation in a second stage in accordance with an embodiment of the present invention.

Figure 20:
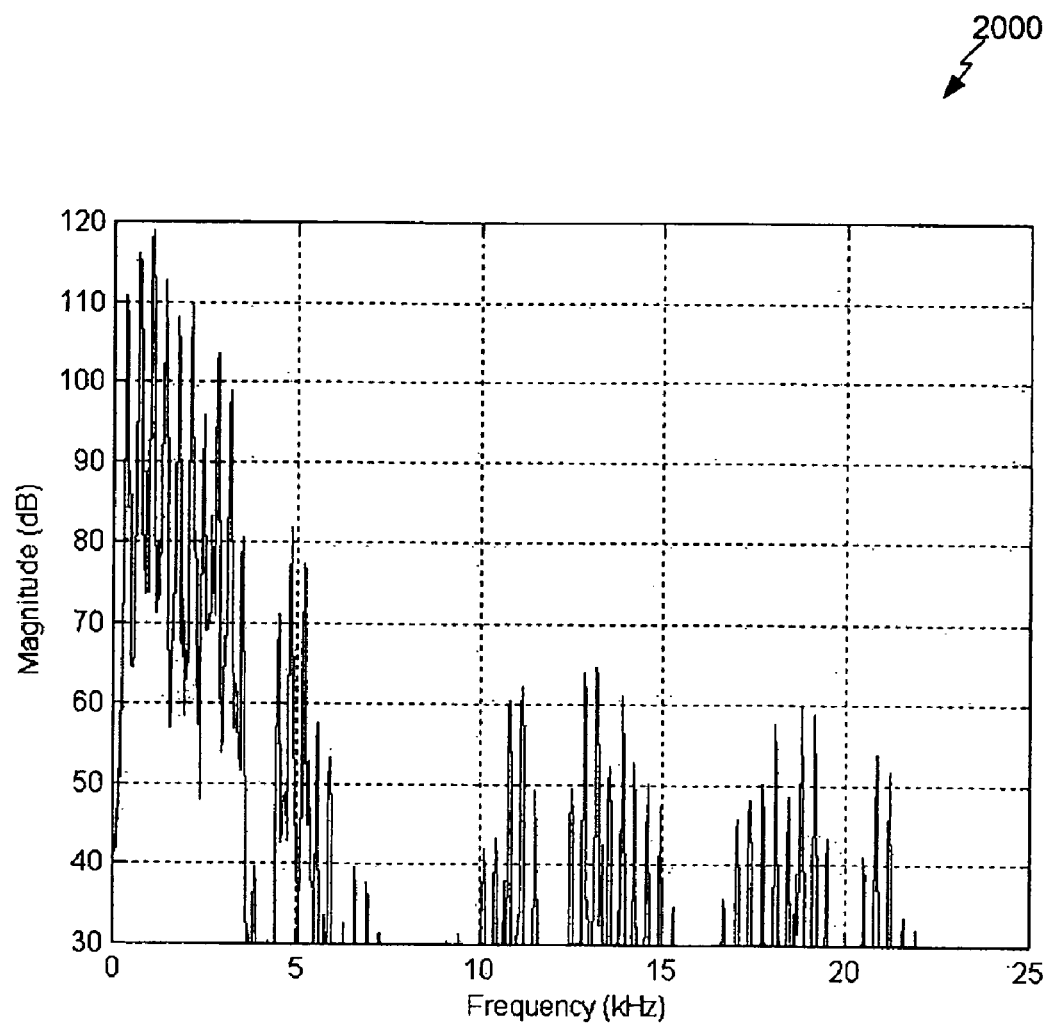

FIG. 20 is a graph that shows the output signal spectrum for a two-stage SRC algorithm using cubic interpolation in a second stage in accordance with an embodiment of the present invention.

Figure 21:
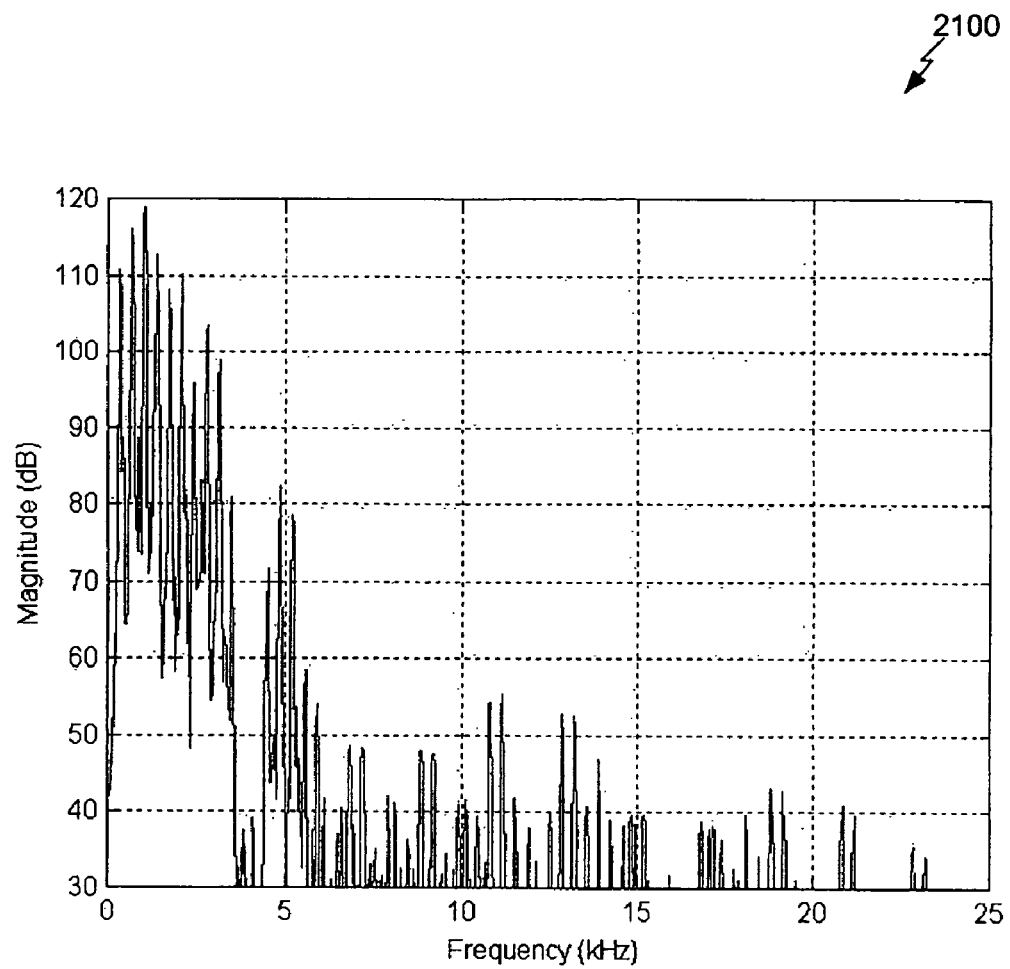

FIG. 21 is a graph that shows the output signal spectrum for a two-stage SRC algorithm using spline interpolation in a second stage in accordance with an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawings in which an element first appears is indicated by the leftmost digit(s) in the corresponding reference number.

DETAILED DESCRIPTION OF THE INVENTION

I. Algorithm Overview

Figure 1:
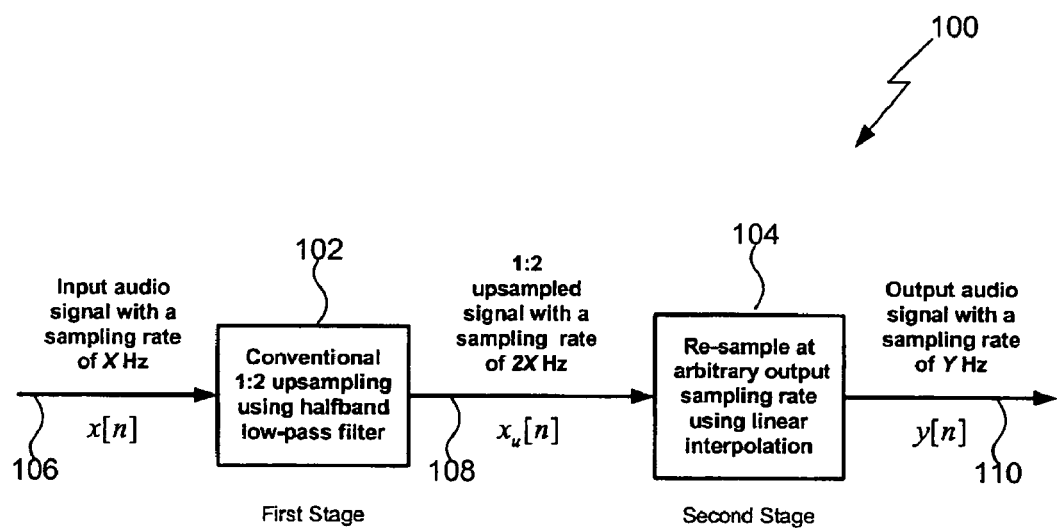
FIG. 1 illustrates the basic structure of a two-stage sampling rate conversion (SRC) algorithm in accordance with an embodiment of the present invention.

FIG. 1 shows the basic structure of a two-stage SRC algorithm 100 for upsampling or downsampling of digital audio signals in accordance with an embodiment of the present invention. SRC algorithm 100 includes a first stage 102 and a second stage 104. First stage 102 upsamples an input audio signal 106 that has a sampling rate of X Hz to produce an upsampled signal 108 with a sampling rate of 2X Hz. First stage 102 preferably comprises a conventional 1:2 upsampler employing a halfband filter. However, as will be discussed elsewhere herein, other upsampling factors and filter types, such as suitable low pass or band pass filters, may be used. Second stage 104 then resamples upsampled signal 108 at a target output sampling rate of Y Hz using linear interpolation between adjacent samples of the 2X Hz upsampled signal. Second stage 104 thereby produces an output audio signal 110 with a sampling rate of Y Hz.

As will be appreciated by persons skilled in the relevant art(s) based on the teachings provided herein, first stage 102 and second stage 104 may be implemented in hardware, software, or a combination thereof. For example, in an embodiment of the present invention, first stage 102 and second stage 104 are implemented, in part, by software running on a host processor and, in part, by a SRC hardware block.

Figure 2:
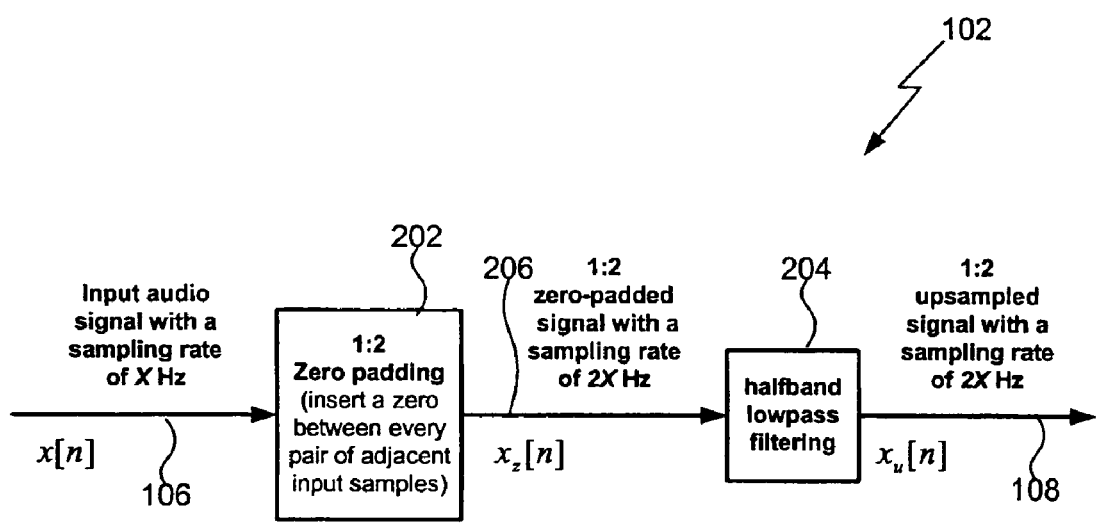
FIG. 2 depicts operations in an upsampling stage of a two-stage SRC algorithm in accordance with an embodiment of the present invention.

On a conceptual level, first stage 102 of FIG. 1 can be further decomposed into two operations as shown as shown in FIG. 2. A first operation 202 comprises performing 1:2 zero padding by inserting a zero sample between every pair of adjacent samples in input audio signal 106. A second operation 204 comprises subsequently performing lowpass filtering of the zero-padded signal 206, preferably using a halfband filter.

FIG. 3 provides a graphical illustration of the digital samples (represented by round dots) corresponding to input audio signal 106, zero-padded signal 206, and upsampled signal 108, respectively. As shown in FIG. 3, zero-padding of input audio signal 106 results in zero-padded signal 206, which is then "smoothed out" by lowpass filtering to produce upsampled signal 108.

A. Halfband Filter

As noted above, in an embodiment of the present invention, a halfband filter is used to perform lowpass filtering during a first stage of a two-stage SRC algorithm. By using a halfband filter for lowpass filtering, an implementation may be achieved that is considerably simpler than that depicted in FIG. 2. This is due to a special property of halfband filters.

By definition, a halfband filter is a symmetric finite impulse response (FIR) digital filter whose impulse response $\{h[n]\}$ has the following property:

$$h[2i]=0 \text{ for } i \neq 0.$$

In a two-stage SRC algorithm in accordance with an embodiment of the invention, a halfband filter with 4 non-zero coefficients on each side is used. For example, the following halfband filter coefficients may be used:

$$h[0]=1;$$

$$h[1]=h[-1]=0.6098363606597559;$$

$$h[3]=h[-3]=-0.1426580934275989;$$

$$h[5]=h[-5]=0.03945777423007257;$$

$$h[7]=h[-7]=-0.006777513830627413; \text{ and}$$

$$h[n]=0 \text{ for all other integer index n not listed above.}$$

In such an implementation, only four memory locations are needed to store the 4 unique halfband filter coefficients. For example, four memory locations in a read-only memory (ROM) may be used for this purpose. The coefficient $h[0]=1$ does not need to be stored.

FIG. 4 is a graph 400 that illustrates the impulse response sequence of this halfband filter. The halfband filter may be designed in accordance with an algorithm described in Oetken et al., "New Results in the Design of Digital Interpolators," IEEE Transactions on Acoustic, Speech and Signal Processing, Vol. ASSP-23, No. 3 (June 1975), pp. 301-309, the entirety of which is incorporated by reference as if fully set forth herein.

Due to the unique property of a halfband filter that every other filter coefficient is zero except for the coefficient h[0], roughly half of the multiplications in the filtering operation can be saved. Furthermore, by making use of the symmetry of the filter coefficients, another factor of 2 can be save in the number of multiplications.

Let $H(e^{j\omega})$ be the Fourier transform of $\{h[n]\}$, or the frequency response of a halfband filter. Then, $H(e^{j\omega})$ is real, and it has been shown that the halfband filter property $h[2i]=0$ for $i\pm 0$ requires that:

$$H(e^{j\omega})+H(e^{j(\pi-\omega)})=2h[0].$$

For example, this is demonstrated in Mintzer, "On Halfband, Third-band, and Nth-band FIR Filters and Their Design," IEEE Transactions on Acoustic, Speech, and Signal Processing, Vol. ASSP-30, No. 5 (October 1982), pp. 734-738, the entirety of which is incorporated by reference as if fully set forth herein.

In other words, the frequency response of a halfband filter is anti-symmetric with respect to the point where $\omega=\pi/2$ and $H(e^{j\omega})=H(e^{j\pi/2})=h[0]$. This anti-symmetrical property can easily be seen in FIG. 5, which is a graph 500 showing the frequency response, in linear scale, of the halfband filter having the impulse response shown in FIG. 4. The horizontal axis is the normalized frequency, where 1.0 corresponds to $\omega=2\pi$, and 0.25 corresponds to $\omega=\pi/2$. The plotted circle indicates the reference point $(\pi/2, h[0])$ for anti-symmetry.

The frequency response illustrated in FIG. 5 shows the characteristics of a lowpass filter, which allows roughly the lower half of the audio signal bandwidth to pass through.

Note that due to the anti-symmetry constraint, the plotted circle in FIG. 5, which represents the frequency response at half the audio bandwidth, is half the magnitude of frequency response in the passband (for example, between 0.0 and 0.1 normalized frequency). This means that the frequency response of the halfband filter is only 6 dB less than the passband at half the "folding frequency," which is itself half the sampling frequency. This is clearly shown in FIG. 6, which is a graph 600 illustrating the same frequency response of FIG. 5 but in logarithmic scale (dB). Although a halfband filter is a very efficient filter, this mere 6 dB attenuation at half the folding frequency can be a fundamental limitation, because it means there will always be some "leakage" right above the normalized frequency of 0.25. In FIG. 6, it can be seen that this "leakage" extends from normalized frequency of 0.25 to about 0.35~0.38 or so, which is quite considerable. Such halfband filter leakage can be reduced significantly, but only by using a very high filter order at the cost of significantly higher complexity.

It is known in the field of digital signal processing that inserting a zero between every pair of signal samples will double the sampling rate and create a mirror image of the signal spectrum above the original folding frequency. For example, if an input audio signal has a sampling rate of 8 kHz, then the audio bandwidth is from 0 to 4 kHz. When such a signal is passed through zero padding block 202 of FIG. 2, the sampling rate is doubled to 16 kHz. The new audio bandwidth is 8 kHz, with the 0 to 4 kHz portion of the spectrum identical to the 0 to 4 kHz spectrum of the original input 8 kHz signal, and the 4 to 8 kHz portion of the spectrum being the mirror image (with respect to 4 kHz) of the 0 to 4 kHz portion of the spectrum. The lowpass filtering block 204 of FIG. 2, which is the halfband filter, then attempts to filter out, or remove, the spectral components between 4 and 8 kHz. The result is a smoothed, upsampled 16 kHz signal. However, due to the "leakage" in FIG. 6 discussed above, some amount of the mirror-imaged spectral components in the 4 to 6 kHz region will leak through and be present in the final smoothed signal.

B. Zero-Padding and Halfband Filtering in a Single Step

As mentioned above, on a conceptual level, first stage 102 in FIG. 1 can be implemented in two successive steps, as depicted in FIG. 2: a zero-padding step 202 followed by a halfband filtering step 204. In an embodiment of the present invention, however, the two steps are combined into a single step in a manner that reduces computational complexity. This may be achieved, in part, because of the large number of zeros in the zero-padded signal and the halfband filter coefficients.

With continued reference to FIG. 2, $\{x[n]\}$, $\{x_z[n]\}$, and $\{x_u[n]\}$ represent input audio signal 106 at X Hz sampling, zero-padded signal 206 at 2X Hz sampling, and lowpass-filtered signal 108 at 2X Hz sampling at the output of the halfband filter, respectively. For a halfband filter with 4 non-zero coefficients on each side as discussed above, the output signal is calculated using the following convolution operation.

$$x_u[n] = \sum_{k=-\infty}^{\infty} h[k]x_z[n-k] =$$

$$\sum_{k=-7}^{7} h[k]x_z[n-k] = \sum_{k=-7}^{7} h[-k]x_z[n-k] = \sum_{k=-7}^{7} h[k]x_z[n+k]$$

The second equality is the result of the particular choice of the halfband filter with $h[k]=0$ for $|k|>7$. The third equality is due to the symmetry of the filter coefficients ($h[k]=h[-k]$). The last equality is the result of a change of variable $k'=-k$. The graphical interpretation of this digital filtering operation is as follows. When calculating a particular output sample $x_u[n]$, the filter coefficient sequence $\{h[k]\}$ is aligned with the signal sequence $\{x_z[n]\}$ in such a way that $h[8]$ is aligned with $x_z[n]$; then, each sample in the $\{x_z[n]\}$ sequence is multiplied by the corresponding aligned sample in the $\{h[k]\}$ sequence, and the resulting product terms are summed together; the resulting value of the summation is $x_u[n]$.

Zero padding step 202 in FIG. 2 doubles the sampling rate by inserting a zero sample between every pair of input samples; therefore, for every new input sample at an input sampling rate of X Hz, there are two corresponding output samples at an output sampling rate of 2X Hz: the first output sample is the inserted zero sample, and the second sample is the new input sample (see example audio input signal 106 and zero padded signal 206 in FIG. 3).

When the halfband filter is calculating the output sample $x_u[n]$ corresponding to an inserted zero sample $x_z[n]=0$, the signal sequence $\{x_z[n]\}$ and the filter coefficient sequence $\{h[k]\}$ are aligned as shown in graphs 702 and 704 of FIG. 7 before the two sequences are sample-by-sample multiplied and the product terms summed to generate $x_u[n]$. Similarly, FIG. 8 provides two graphs 802 and 804 that show the alignment of the two sequences when the halfband filter is calculating the output sample $x_u[n]$ corresponding to an original input sample $x[n]$.

In accordance with an embodiment of the invention, the halfband filtering operation can only have two kinds of sequence alignment: either the alignment shown in FIG. 7 or the alignment shown in FIG. 8. There is no other possibility. In the first case, when the sequence alignment is as shown in FIG. 8 above, the zero samples in zero-padded signal 206 are aligned with non-zero filter coefficients, and zero filter coefficients are aligned with non-zero samples in zero-padded signal 206. The only exception is the aligned non-zero samples at $x_z[n]$ and $h[0]=1$. Therefore, the halfband filter output is:

$$x_u[n]=h[0]x_z[n]=x_z[n].$$

In other words, the non-zero samples of the zero-padded signal pass through the halfband filter unchanged, and therefore no computation is necessary to obtain these corresponding filter output signal samples.

In the second case, with the sequence alignment shown in FIG. 7, it is clear that summation for the filtering operation involves only eight non-zero terms for $k=-7, -5, -3, -1, 1, 3, 5,$ and $7$.

$$x_u[n] = \sum_{i=-4}^{3} h[2i+1]x_z[n+2i+1]$$
$$= h[-7]x_z[n-7] + h[-5] + \ldots +$$
$$h[5]x_Z[n+5] + h[7]x_Z[n+7].$$

To implement the above equation would require eight multiplication and seven addition operations. However, since $h[k]=h[-k]$, this equation can be re-written as:

$$x_u[n] = \sum_{i=0}^{3} h[2i+1](x_Z[n+2i+1] + x_Z[n-2i-1])$$
$$= \sum_{k=1,3,5,7} h[k](x_Z[n+k] + x_Z[n-k]).$$

By using this last equation, the computational complexity of this filtering operation can be reduced to four multiplication operations and seven addition operations. Combining this with the fact that in the first case above no computation is necessary when a non-zero sample of zero-padded signal 206 passes through the halfband filter unchanged, zero-padding step 202 and halfband filtering step 204 of FIG. 2 can be combined into a single operation with a complexity of only four multiplication and seven addition operations per input sample.

In other words, an embodiment of the invention never needs to actually insert zero samples between input samples, and then feed the resulting zero-padded signal through a halfband filter, in order to implement upsampling stage 102 of FIG. 1. Instead, in accordance with this embodiment, stage 102 is implemented by calculating, for each new input sample, two corresponding output samples. One of the two corresponding output samples is simply a copy of the new input sample. The other sample, which may be thought of as an inserted sample, is calculated using the last equation described above with only four multiplication and seven addition operations.

C. Second-Stage Linear Interpolation

Second stage 104 of FIG. 1 performs simple linear interpolation between adjacent samples of first-stage output signal 108 when resampling the signal at the target output sampling rate Y Hz. This operation is illustrated in a graph 900 of FIG. 9. The thinner lines and dots show the samples of the 1:2 upsampled signal $\{x_u[n]\}$ at the input of second stage 104 of FIG. 1. The thicker lines and dots show the samples of second stage output signal $\{y[n]\}$, after resampling using linear interpolation.

The following is an example of a method for calculating the sample values of $\{y[n]\}$. Suppose one wants to calculate the sample value $y[t]$ shown in FIG. 9. The straight line connecting $x_u[n]$ and $x_u[n+1]$ has a slope of $x_u[n+1]-x_u[n]$. The horizontal distance between the sample $y[t]$ and the sample $x_u[n]$ is $\Delta=t-n$. Therefore, the desired sample value is calculated as:

$$y[t]=x_u[n]+\text{slope}\times(\text{horizontal distance})=x_u[n]+(x_u[n+1]-x_u[n])(t-n).$$

This method is also the method used in a C code implementation of the two-stage SRC algorithm provided herein. Various other methods for calculating the sample values of $\{y[n]\}$ are readily available to persons skilled in the relevant art(s).

D. Graphical Illustrations in Time and Frequency Domains

FIGS. 10 and 11 show examples 1000 and 1100, respectively, of the time-domain waveform samples of the input signal $\{x[n]\}$ as circles, the 1:2 upsampled signal $\{x_u[n]\}$ as squares, and the final SRC output signal $\{y[n]\}$ as dots. Note that every sample in the $\{x[n]\}$ sequence (circle) is also a sample in the $\{x_u[n]\}$ sequence (square), consistent with the example embodiment discussed above in Section I.B.

FIG. 10 provides an example of upsampling a few samples of a trumpet signal from 8 kHz to 48 kHz. The intermediate upsampled signal (i.e., the squares) has a sampling rate of 16 kHz. FIG. 11 shows an example of downsampling a few samples of a violin signal from 48 kHz to 44.1 kHz. The intermediate upsampled signal in this case has a sampling rate of 96 kHz.

Note that in FIGS. 10 and 11, all output signal samples (dots) fall on piece-wise linear segments connecting the squares that represent the intermediate signal after 1:2 upsampling of first stage 102. If conventional single-stage linear-interpolation-based SRC were used, then all dots representing the output signal samples would fall on straight lines connecting the circles. The resulting output signal will be less smooth (i.e., it would have more high-frequency content) than the output signal shown in FIGS. 10 and 11. This increased amount of high-frequency content gives rise to loud high-frequency image distortion, especially when upsampling from 8 kHz to 48 kHz. This may be referred to as "image distortion" because the distortion results from mirror images of the original input spectrum. This is illustrated in spectral plots discussed below.

FIG. 12 is a graph 1200 of the spectrum of an 8 kHz-sampled input trumpet solo signal. This input signal corresponds to the input audio signal 106 represented by x[n] in FIGS. 1 and 2. A 256-point Hanning window and a 256-point fast Fourier transform (FFT) were used to obtain this spectral plot. The spectrum has a harmonic structure with a 350 Hz pitch frequency. The original 8 kHz-sampled input signal has been band-limited to about 3.5 kHz.

FIG. 13 is a graph 1300 showing the spectrum of the 16 kHz 1:2 zero-padded signal corresponding to the same segment of 256 x[n] samples that were used in calculating the spectrum in FIG. 12. This signal is the zero-padded signal 206 represented by $x_z[n]$ in FIG. 2. Since the sampling rate has been doubled, the same 256 samples now produce 512 zero-padded samples. A 512-point Hanning window and a 512-point FFT were used to obtain this spectral plot. It is clear from FIG. 13 that the portion of the spectrum in the 4 to 8 kHz region is simply a mirror image of the "base-band" spectrum in the 0 to 4 kHz region, and this base-band spectrum is itself essentially identical to the spectrum in FIG. 12, except that it is shown in a compressed scale. This phenomenon was also described above in Section I.A. This "image" spectrum in the 4 to 8 kHz range was not in the original 8 kHz-sampled input signal, so it is a distortion that should be removed as much as possible.

The halfband filter used to implement lowpass filtering block 204 of FIG. 2 attempts to remove this image distortion between 4 and 8 kHz. However, due to the fundamental limitation of the halfband filter discussed in Section I.A, namely, that its frequency response (as shown in FIG. 6) has only 6 dB of attenuation at 4 kHz and has significant "leakage" from 4 kHz out to about 6 kHz, the halfband filter cannot completely remove this image distortion.

FIG. 14 is a graph 1400 that shows the spectrum of the 1:2 upsampled signal $x_u[n]$ after the same 512 samples of $x_z[n]$ signal used to generate FIG. 13 were passed through the halfband filter defined with reference to FIG. 4. Although this plot is obtained by taking 512-point FFT of the time-domain halfband filtered signal, it is equivalent to adding the frequency response curve in FIG. 6 to the spectrum in FIG. 13. It can be seen from FIG. 14 that there is some "leakage", or residual image distortion in the 4 to 6 kHz region due to the limitation of the halfband filter. In reality, however, due to an auditory masking effect, this residual image is not very noticeable perceptually. Actually, it is essentially inaudible most of the time and only barely noticeable at other times. Therefore, this halfband filter represents a good design compromise, as it has an extremely low complexity and nevertheless effectively suppresses the image distortion.

FIG. 15 is a graph 1500 showing the spectrum of the final 48 kHz SRC output signal after the 1:2 upsampled signal used to generate FIG. 14 was upsampled by a factor of 3 using linear interpolation. This final SRC output signal corresponds to the y[n] signal 110 shown in FIG. 1. Due to the 1:3 upsampling, the 512 samples of $x_u[n]$ signal used to generate FIG. 14 now become 1536 samples. Therefore, a 1536-point Hanning window and a 1536-point FFT was used to obtain FIG. 15. Comparing the 0 to 8 kHz base-band spectrum in FIG. 15 with the spectrum in FIG. 14, it can be seen that the spectrum in FIG. 15 has been shifted up by nearly 10 dB. This is due to the tripling of the FFT size, resulting in a tripling of discrete Fourier transform (DFT) coefficient magnitude, which is an increase of $10 \log_{10}(3^2)$ =9.54 dB. Note that the base-band spectrum in the 0 to 8 kHz region is essentially identical to the spectrum in FIG. 14 except for this artificial 9.54 dB shift. Also note that there are two attenuated mirror images: one from 8 to 16 kHz, and the other from 16 to 24 kHz. The amount of attenuation is determined by the frequency response of the linear-interpolation-based upsampler.

FIG. 16 is a graph 1600 that shows the spectrum of an SRC output signal when conventional linear interpolation is used to perform single-stage 1:6 upsampling. The same segment of input signal shown in FIG. 12 is used. The first two images (4 to 12 kHz) in FIG. 16 are where most of the perceived image distortion comes from. A two-stage SRC algorithm in accordance with an embodiment of the present invention greatly suppresses these two images and makes the resulting SRC output signal sound far superior. Note that the images in FIG. 15 from 10 to 20 kHz are not very audible because the frequency is very high (thus harder to detect) and they are 40 dB down from the base-band peaks.

FIG. 17 is a graph 1700 that shows the spectrum of the SRC output signal of an alternative implementation of a two-stage SRC algorithm in accordance with the present invention. This alternative method uses 1:3 upsampling with third-band filtering, followed by 1:2 upsampling with linear interpolation. The first-stage output signal has a sampling rate of 8×3=24 kHz, with an audio bandwidth of 12 kHz. Thus, the first image in the 1:2 linearly interpolated signal is from 12 to 24 kHz. This has the advantage that the strong base-band spectrum from 0 to 4 kHz that comes from the 8 kHz input signal is now "flipped over" and "mirror imaged" to the 20 to 24 kHz range, which is out of the normal human hearing range of 20 Hz to 20 kHz. Comparing FIGS. 17 and 15, we can see that this method further cleans up the image distortion in the 10 to 20 kHz region and thus makes the output sound even cleaner.

FIG. 18 is a graph 1800 that shows the spectrum of the SRC output signal of yet another alternative implementation of a two-stage SRC algorithm in accordance with the present invention. This time, a $10^{th}$-order elliptic filter (a pole-zero filter) replaces the third-band filter. As shown in FIG. 18, all image distortion from 4 to 20 kHz is completely removed. Only a noise floor 95 dB below peaks remains. The 20 to 24 kHz image is inaudible, so this scheme gives a high-fidelity output.

II. Details of Algorithm Implementation

A. Floating-Point C Code Implementation

An example floating-point C code implementation of a two-stage SRC algorithm in accordance with an embodiment of the invention will now be described. In this embodiment, the SRC algorithm is implemented using a host processor and a hardware SRC block. The following are essential portions of a main program for such an implementation:

```
#define xlimit (1.0+2e-015)   /* allow some margin around 1 */
double sfi, sfo, ior, xi, x[8];
            /* ior, xi, x[8] are RAM in hardware SRC */
double *r1, *r2, *r3, a0;
            /* registers and accumulator in ALU */
double b[]={ -6.777513830627413e-003, 3.945777423007257e-002,
            -1.426580934275989e-001,
            6.098363606597559e-001};
            /* filter coefficients */
short inbuf[1], outbuf[1]; /* input and output sample buffer */
int n;
        .
        .     /* skip some code for command-line */
        .     /* input/output handling */
        .
sfi=atof(argv[3]);      /* input sampling rate */
sfo=atof(argv[4]);      /* output sampling rate */
sfi=2*sfi;              /* sampling rate of first-stage output signal */
ior=sfi/sfo;  /* input/output sampling ratio for second stage */
xi=ior;  /* initialize the first sampling instant for output */
memset(x, 0, 8*sizeof(double));
            /* initialize x[] input array to zero */
/* START THE MAIN FRAME LOOP */
while (fread(inbuf,sizeof(short),1,fi) == 1) {
            /* read a new input sample */
    for (n=0;n<7;n++) x[n]=x[n+1];
            /* shift old input samples in x[] array */
    x[7]=*inbuf;    /* copy new input sample into x[] array */
            /* FIRST-STAGE 1:2 UPSAMPLING USING
               ZERO-PADDING */
            /* & HALFBAND FILTERING */
    r1=b;
    r2=x;
    r3=&x[7];
    a0 = *r1++ * (*r2++ + *r3--);
```

-continued

```
        /* do first multiply separately */
    for (n=0;n<3;n++) {
            /* do the other 3 multiply-accumulate operations */
        a0 += *r1++ * (*r2++ + *r3--); /* halfband filtering */
    }
    x[0]=a0;    /* x[0] no long needed */
            /* use it to store interpolated sample */
        /* These 5 lines above show DSP-style implementation */
        /* equivalent to                                    */
        /* x[0]=b[0]*(x[0]+x[7])+b[1]*(x[1]+x[6])+          */
        /* b[2]*(x[2]+x[5])+b[3]*(x[3]+x[4]);               */
        /* SECOND-STAGE RE-SAMPLING USING
           LINEAR INTERPOLATION */
    while (xi <= xlimit) {
            /* while interpolation time instant within limit*/
        a0 = (x[0]-x[3])*xi+x[3]; /* do linear interpolation */
        *outbuf = round_and_clip(a0);
            /* round to 16-bit PCM & clip if needed*/
        fwrite(outbuf,sizeof(short),1,fo);
            /* write output PCM sample to file*/
        xi=xi+ior;
            /* increment interpolation time instant for next sample */
    }
    xi=xi-1.0;
            /* update interpolation time instant for next loop */
    while (xi <= xlimit) {
            /* while interpolation time instant within limit*/
        a0 = (x[4]-x[0])*xi+x[0]; /* do linear interpolation */
        *outbuf = round_and_clip(a0);
            /* round to 16-bit PCM & clip if needed*/
        fwrite(outbuf,sizeof(short),1,fo);
            /* write output PCM sample to file*/
        xi=xi+ior;
            /* increment interpolation time instant for next sample */
    }
    xi=xi-1.0;
            /* update interpolation time instant for next loop */
}           /* END OF THE MAIN FRAME LOOP */
```

The following explanation of this floating-point C code references the algorithm description provided above in Section I.

Besides memory for storing the program code itself, this SRC algorithm requires four memory locations, such as locations in ROM, to store the four distinct halfband filter coefficients. In this C code:

$b[0]=h[-7]=h[7]$;

$b[1]=h[-5]=h[5]$;

$b[2]=h[-3]=h[3]$;

$b[3]=h[-1]=h[1]$;

and h[0]=1 does not need to be stored.

The variables sfi and sfo represent input sampling rate and output sampling rate, respectively. These two variables can be handled by the host processor only and do not need to be passed to the hardware SRC block. The variable ior is the ratio of input sampling rate and output sampling rate. It is calculated by the host processor and then passed to the SRC hardware; its value remains constant during the conversion of a particular audio stream, as long as the input and output sampling rates do not change.

The variable xi and the input signal array x[] comprise local variables in the SRC hardware. The 8-element array x[] stores the 8 consecutive samples of the input audio signal x[n] that are needed to perform halfband filtering. These 8 input samples correspond to the 8 non-zero samples of zero-padded signal $x_z[n]$ shown in FIG. 7 with the following correspondence:

$x[0]=x_z[n-7]$;

$x[1]=x_z[n-5]$;

$x[2]=x_z[n-3]$;

$x[3]=x_z[n-1]$;

$x[4]=x_z[n+1]$;

$x[5]=x_z[n+3]$;

$x[6]=x_z[n+5]$; and $x[7]=x_z[n+7]$.

The SRC hardware may comprise ten memory locations, such as memory locations in random access memory (RAM), to store ior, xi, and x[8] for each audio channel that it handles. Before sampling rate conversion starts, xi is initialized to ior, and the x[] array is initialized to zero. The actual operation of the SRC hardware is inside the main frame loop (the outermost while loop in the code). Here each "frame" actually degenerates to only one single sample of the input audio signal to the SRC hardware. This single input sample is stored in inbuf[0], or *inbuf. Such an arrangement eliminates any need to maintain an array of input samples within the SRC hardware, which would require more memory space and silicon area.

At the beginning of the main frame loop, the following portion of the code

```
for (n=0;n<7;n++) x[n]=x[n+1];
        /* shift old input samples in x[] array */
    x[7] =*inbuf;      /* copy new input sample into x[] array */
``` basically shifts the x[] array by one sample (by overwriting x[0] through x[6] with x[1] through x[7]) and then overwrite x[7] with the new input sample *inbuf.

The C code in the following lines:

```
r1=b;
    r2=x;
    r3=&x[7];
    a0 = *r1++ * (*r2++ + *r3--);
            /* do first multiply separately */
    for (n=0;n<3;n++) {
            /* do the other 3 multiply-accumulate operations */
        a0 += *r1++ * (*r2++ + *r3--); /* halfband filtering */
    }
    x[0]=a0;       /* x[0] no long needed */
                /* use it to store interpolated sample */
``` first assigns array addresses to the three pointer registers. The register r1 points to b [0], the register r2 points to x[0], and the register r3 points to x[7] . Then, it performs the halfband filtering operation. In Section I.B, it was demonstrated that the halfband filtering operation can be expressed as $$x_u[n] = \sum_{i=0}^{3} h[2i+1](x_Z[n+2i+1] + x_Z[n-2i-1])$$

$$= \sum_{k=1,3,5,7} h[k](x_Z[n+k] + x_Z[n-k]).$$

Writing out all four terms, and using the definition of the b [] and x[] arrays previously defined in this section, the result is:

$$x_u[n]=h[7](x_z[n+7]+x_z[n-7])+h[5](x_z[n+5]+x_z[n-5])+$$
$$h[3](x_z[n+3]+x_z[n-3])+h[1](x_z[n+1]+x_z[n-1])=b$$
$$[0](x[7]+x[0])+b[1](x[6]+x[1])+b[2](x[5]+x[2])+$$
$$b[3](x[4]+x[3])$$

Persons skilled in the relevant art(s) will be readily able to verify that the lines of C code listed immediately above perform the operation in this equation. The resulting filter output sample $x_u[n]$ is in the accumulator a0, and is used to overwrite x[0]. This overwriting can be performed because after this filtering operation is performed until the end of the main frame loop, the oldest input signal sample stored in x[0] is no longer needed, and therefore the memory location of x[0] can be re-used to store the halfband filter output sample $x_u[n]$, which is the sample between x[3] and x[4] (or the sample between $x_z[n-1]$ and $x_z[n+1]$ in FIG. 7) in the 1:2 upsampled signal sequence $\{x_u[n]\}$.

The next two while loops in the C code complete the linear-interpolation-based resampling operation for the following two time periods, respectively: the time period between the two samples x[3] and x[0] (or $x_z[n-1]$ and $x_z[n]$ in FIG. 7), and the time period between the two samples x[0] and x[4] (or $x_z[n]$ and $x_z[n+1]$ in FIG. 7). In an alternate embodiment, a single while loop inside a for loop may be used, although this requires more memory locations and may therefore be less desirable. The two while loops are identical except for the elements of the x[] array used.

For convenience, the code around the second while loop is repeated and discussed below.

```
while (xi <= xlimit) {
        /* while interpolation time instant within limit*/
        a0 = (x[4]-x[0])*xi+x[0]; /* do linear interpolation */
        *outbuf = round_and_clip(a0);
            /* round to 16-bit PCM & clip if needed*/
        fwrite(outbuf,sizeof(short),1,fo);
            /* write output PCM sample to file*/
        xi=xi+ior;
         /* increment interpolation time instant for next sample */
}
xi=xi-1.0;
        /* update interpolation time instant for next loop */
```

The constant xlimit is defined to be 1.0+2e−015. However, it does not need to be precisely that value. The idea is just to set a threshold slightly larger than 1.0, so that when the variable xi is supposed to be incremented to 1.0, if the numerical round-off error of the floating-point arithmetic causes it to be just barely above 1.0, the test (xi<=xlimit) in the while statement will still be true. This is useful when the output sampling rate is an integer multiple of the input sampling rate (such as converting from 8 kHz to 48 kHz), as it helps to maintain a constant number of output samples for each new input sample. In reality, however, even if xlimit is set to precisely 1.0, the algorithm will still work. If xi is incremented to a value just barely above 1.0 when it should have been precisely 1.0, then the corresponding output sample will not be written to the output buffer in the outermost while loop for the current input sample, but it will be written to the output buffer in the outermost while loop for the next input sample. Therefore, the net result is the same.

The line of code

```
a0 = (x[4]-x[0])*xi+x[0];        /* do linear interpolation */
``` implements the equation $$y[t]=x_u[n]+slope \times (horizontal\ distance)=x_u[n]+(x^u[n+1]-x_u[n])(t-n)$$

discussed above in Section I.C. Here $x_u[n]=x[0]$, $x_u[n+1]=x[4]$, and xi is the horizontal distance, or the elapsed time from the sampling time instant of $x_u[n]$.

The following portion of the code

```
*outbuf = round_and_clip(a0);
        /* round to 16-bit PCM & clip if needed*/
``` calls a C function round_and_clip( ) to round off the linearly interpolated output sample value from floating-point value to its nearest integer value, and saturate the value to the maximum (32767) or minimum (−32768) value allowed if the value exceeds the numerical range that can be respresented by a 16-bit signed integer. The resulting integer output sample value is then written to the output buffer outbuf [0], or *outbuf. The simple C function round_and_clip( ) is provided below.

```
short round_and_clip(double x)
{x = (x>=0) ? (x+0.5) : (x-0.5);
        /* round input x to nearest integer */
    if (x>32767.0) x=32767.0;
        /* clip if x > 32767 to avoid wrap around */
    if (x<-32768.0) x=-32768.0;
        /* clip if x < -32768 to avoid wrap around*/
    return ((short) x);    /* convert x to 16-bit short integer */
}
```

The next fwrite statement simply writes this output signal sample *outbuf to the disk file for the SRC output signal. The code

```
xi=xi+ior;
    /* increment interpolation time instant for next sample */
``` increments the sampling time instant for the next SRC output sample.

In FIG. 9, it can be seen that in this two-stage SRC algorithm, it is assumed that 1.0 is the difference between the sampling time instants of two adjacent samples of the intermediate 1:2 upsampled signal sequence $\{x_u[n]\}$. Based on this, the last portion of the code

```
xi=xi-1.0;
    /* update interpolation time instant for next loop */
``` updates the sampling time instant xi for the next while loop (which is the first while loop for the next input sample). A constant 1.0 is subtracted from xi here because the sampling time instant xi had just passed the sampling time instant of $x_u[n+1]$.

Note that the same two while loops in the linear interpolation code above will also work for downsampling. During the downsampling operation, the input-output sampling rate ratio ior is greater than 2, and on average one SRC output sample is generated for every ior samples of the intermediate 1:2 upsampled signal sequence $\{x_u[n]\}$. In this case, the variable xi is usually greater than 1.0, and therefore most of the time the two while loops are skipped and not entered. Each time a while loop is skipped because xi>xlimit, the value of xi is decremented by 1.0. This is repeated until the condition 0<xi<=xlimit is met, at which time the while loop is entered, linear interpolation is performed, an SRC output sample is calculated and written to the output file, and then xi is incremented by ior again. The cycle then repeats with skipped while loops, and so on. Thus, the same code works for both downsampling as well as upsampling.

B. Fixed-Point C Code Implementation

An example 32-bit fixed-point C code implementation of a two-stage SRC algorithm in accordance with an embodiment of the invention will now be described. This fixed-point C code follows the same sequence of operations as in the floating-point C code, except that there are certain fixed-point-specific operations that have been added. Since the principles of operation have been explained above for the floating-point C code, only the main differences between the floating-point and the fixed-point implementations well be discussed here.

Essential portions of a main program of the 32-bit fixed-point C code are provided below.

```
#define xlimit 1024*65536      /* xlimit = 1.0 in Q26 format */
Word64 a0;                     /* accumulator */
Word32 xi, ior;                /* RAM memory, in Q26 format */
Word32 x[8];                   /* RAM memory, input audio signal buffer */
Word32 b[]={-14554600,84734925,-306355923,1309613612};
                               /* hlf-fltr coeff Q31 */
Word16 inbuf[1], outbuf[1];
                               /* input and output sample buffer */
Word32 *r1, *r2, *r3;          /* registers */
int n;
      .
      .
      .
sfi=2*atof(argv[3]);
                               /* sampling rate of first-stage output signal */
sfo=atof(argv[4]);             /* output sampling rate */
ior=(Word32)(xlimit*sfi/sfo);
                               /* I/O sampling Ratio of 2nd stage*/
xi=ior;
                               /* initialize the first sampling instant for output */
memset(x,0,8*sizeof(Word32));
                               /* initialize x[] input array to zero */
/* START THE MAIN FRAME LOOP */
while (fread(inbuf,sizeof(short),1,fi) == 1) {
                               /* read a new input sample */
    for (n=0;n<7;n++) x[n]=x[n+1];
                               /* shift old input samples in x[] array */
    x[7]=L_shr(L_deposit_h(*inbuf),1);
                               /* copy new input sample into x[] array */
    /* FIRST-STAGE 1:2 UPSAMPLING */
    /* USING ZERO-PADDING & HALFBAND FILTERING */
    r1=b;
    r2=x;
    r3=&x[7];
    a0=L_mult64(*r1++, L_add(*r2++, *r3--));
                               /* do first multiply separately */
    for (n=0;n<3;n++) {
                               /* do the other 3 multiply-accumulate operations */
        a0 = L_mac64(a0, *r1++, L_add(*r2++, *r3--));
    }
    a0 = L_shl64(a0, 1);
                               /* left shift 64-bit accumulator by 1 bit */
    x[0] = round64(a0);
                               /* use x[0] to store interpolated sample */
    /* SECOND-STAGE RE-SAMPLING USING LINEAR
    INTERPOLATION */
    while (xi <= xlimit) {
                               /* while interpolation time instant within limit*/
        a0.hi = x[3]>>6;
                               /* load high word of a0 for (x[3]<<26) */
        a0.lo = (x[3]&0x003f)<<26;
                               /* load low word of a0 for (x[3]<<26) */
        a0 = L_mac64(a0, xi, L_sub(x[0],x[3]));
                               /* do linear interpolation */
        a0 = L_shl64(a0,1+6);
                               /* left shift 1 more bit because x[7]>>1 above */
        *outbuf = round(a0.hi);
                               /* round to 16bit PCM & clip if needed */
        fwrite(outbuf,sizeof(Word16),1,fo);
                               /* write output sample to file */
        xi=L_add(xi,ior);
                               /* get interpolation time instant for next sample */
    }
    xi=L_sub(xi,xlimit);
                               /* update interpolation time instant for next loop */
    while (xi <= xlimit) {
                               /* while interpolation time instant within limit*/
        a0.hi = x[0]>>6;
        a0.lo = (x[0]&0x003f)<<26;
        a0 = L_mac64(a0, xi, L_sub(x[4],x[0]));
                               /* do linear interpolation */
        a0 = L_shl64(a0,1+6);
        *outbuf = round(a0.hi);
                               /* round to 16bit PCM & clip if needed */
        fwrite(outbuf,sizeof(Word16),1,fo);
                               /* write output sample to file */
        xi=L_add(xi,ior);
                               /* get interpolation time instant for next sample */
    }
    xi=L_sub(xi,xlimit);
                               /* update interpolation time instant for next loop */
}                              /* END OF THE MAIN FRAME LOOP */
```

In the above code, the halfband filter coefficient array b [] is represented by the so-called Q31 format. A QN format means that the N least significant bits of the binary representation represent the fractional portion of the underlying real number. Since the largest magnitude of the four elements of b [] is between 0.5 and 1.0, the most significant bit (MSB) can be used to represent the sign, and the 31 least significant bits (LSBs) of the 32-bit data word can be used to represent fractional portion of each element of b []. In the above code, 32-bit signed integers are assigned to the elements of the array b []. The real value of each element of b [] is simply the corresponding 32-bit signed integer divided by $2^{31}$.

The constant xlimit and the variables xi and ior are all represented in Q26 format. Q26 is used because it is assumed that the largest value of ior occurs when the largest sampling rate of interest (96 kHz) is converted to the lowest sampling rate of interest (8 kHz). In this case, the sampling rate of first-stage 1:2 upsampling is 192 kHz, and therefore ior=192/8=24, which is an integer that requires a 5 bit representation. Hence, to represent ior, 1 bit is needed for the sign, 5 bits are needed for the integer portion, and 32−1−5=26 bits are needed for the fractional portion. Consequently, the Q26 format is used for ior. Since xi and xlimit have the same scale as ior, they naturally should also be in Q26 format.

The following portion of the code

```
x[7]=L_shr(L_deposit_h(*inbuf),1);
    /* copy new input sample into x[] array */
``` loads the 16-bit input pulse code modulated (PCM) sample to the high word of a 32-bit data word (with the low word being zero), and then right shifts the 32-bit word by 1 bit. This 1-bit right shift is necessary, because without it later calculations (x[0]−x[3]) and (x[4]−x[0]) can potentially overflow. One bit of headroom should be reserved in the representation of the elements of x[] to ensure that when an element of x[] is subtracted from another element of x[], the resulting 32-bit data word will not overflow. If the word length of the input audio samples is 16 bits (as is assumed in the C code above), this right shift will not result in any precision loss. Assuming that the input 16-bit PCM samples are 16-bit integers in Q0 format, then the 32-bit data word after loading the 16-bit PCM sample to the high word will be in Q16 format, and after the right shift by 1 bit, the resulting element of x[] will be in Q15 format.

The following portion of the code

```
a0 = L_shl64(a0, 1);
    /* left shift 64-bit accumulator by 1 bit */
x[0] = round64(a0);
    /* use x[0] to store interpolated sample */
``` shifts the content of the 64-bit accumulator a0 to the left by one bit, then perform a rounding operation to the high word of a0 and assign the high word to x[0]. The left shift by 1 bit is necessary because the filter coefficients in b [] are in Q31 format and the elements of the x[] array are in Q15 format, so the multiplier output 64-bit value would be in Q(31+15)=Q46 format if there were no left shift by 1 bit. With the 1 bit left shift, the content of a0 is in Q47 format. Extracting the high word will result in Q(47−32)=Q15 format, which is a return to what the Q format of x[0 ] should be. If this 1 bit left shift had not been performed, then the resulting value of x[0] would have been in Q14 format, which would be wrong.

The portion of code

```
a0.hi = x[3]>>6;
    /* load high word of a0 for (x[3]<<26) */
a0.lo = (x[3]&0x003f)<<26;
    /* load low word of a0 for (x[3]<<26) */
a0 = L_mac64(a0, xi , L_sub(x[0],x[3]));
    /* do linear interpolation */
a0 = L_shl64(a0,1+6);
    /* left shift 1 more bit because x[7]>>1 above */
``` implements the floating-point code

```
a0 = (x[0]−x[3])*xi+x[3];    /* do linear interpolation */
```

Note that before (x[0]−x[3]) *xi can be added to x[3], x[3] must be in the same scale (i.e. same Q format) as (x[0]−x[3]) *xi. Now, the 32-bit word for (x[0]−x[3]) is in Q15 format as discussed above, and xi is in Q26 format. The product of the two will be in Q(15+26)=Q51 format. Therefore, when x[3] is loaded to the 64-bit accumulator a0, it must also be in Q51 format so it can be added to the product term directly. The variable x[3] could be loaded to the low word of a0, and then left-shifted 26 bits to make it Q(15+26)=Q51 format. Equivalently, x[3] could be loaded to the high word of a0, and right-shifted 32−26=6 bits. The result would be the same.

The two 32-bit integers a0.hi and a0.lo are used to simulate a 64-bit accumulator, since the C language does not support 64-bit integers intrinsically. Thus, loading x[3] to a0.hi and then right shifting 6 bits results in the desired high word of the 64-bit accumulator, and loading the 6 LSBs of x[3] (that is, (x[3] &0x003f) ) to a0.lo and left shifting 26 bits will provide the desired low word of the 64-bit accumulator. Note that these operations are necessary only in C code because C does not support 64-bit operations. It should be understood that in corresponding SRC hardware where there is a real 56-bit or 64-bit accumulator, the whole word of x[3] should be loaded at one time to either the high word or the low word of the accumulator, and then the accumulator should shift the necessary number of bits to make the content in the same scale as the multiplier output for (x[0]−x[3]) *xi.

It should be noted that the last statement in the code portion above shifts the content of a0 to the left by 7 bits (rather than the right-shifting of 6 bits of x[3] when loading it to a0). This additional left shift is to compensate for the one-bit right shift performed on x[7] earlier, so that the 16 MSBs of the resulting a0 will have the same scale as the input audio signal samples.

III. Choice of Upsampling Factor and Lowpass Filter in First Stage

For the two-stage SRC algorithm shown in FIG. 1, generally the higher the upsampling factor in first stage 102, the better the overall SRC performance. Similarly, the higher the quality of the lowpass filter used in first stage 102 (especially in terms of stop-band attenuation), the better the SRC performance. The two-stage SRC embodiment described herein using 1:2 upsampling and an 8-tap halfband filter represents a compromise that provides the lowest complexity while maintaining a fairly good output audio quality.

However, in a system that can actually support higher complexity than this SRC algorithm, an algorithm using a higher upsampling factor, or a better quality lowpass filter, or both, may be used. For example, by using 1:3 upsampling and a third-band filter in first stage 102, the output audio quality is improved. This is illustrated in the example of FIG. 17, where the spectral image distortion in the 10 to 20 kHz range is much lower than in FIG. 15. Furthermore, in this same example, if the third-band filter is replaced by a high-quality $10^{th}$-order elliptic filter, then the spectral image distortion in the audible range of 20 Hz to 20 kHz can be eliminated altogether, as shown in FIG. 18. This approach takes 20 multiply-accumulate operations per upsampled signal sample at the output of first stage 102. It should be noted that the substantial reduction or elimination of stop-band leakage can likewise be achieved using high quality filters other than $10^{th}$-order elliptic filters, including but not limited to high quality lowpass or bandpass filters.

IV. Alternative Re-Sampling Methods for Second Stage

Alternative methods to linear interpolation can be used in second stage 104 of FIG. 1 to achieve improved audio quality. Such alternative methods include quadratic interpolation, cubic interpolation, and spline interpolation for arbitrary sampling rate ratios. The spline interpolation method has a very high complexity for implementation because it uses a large number of DSP-unfriendly division operations. Averaged quadratic interpolation and cubic interpolation methods, on the other hand, are implementable with reasonable complexity.

An averaged quadratic interpolation method re-samples the input signal using the average of two quadratic polynomial functions. Specifically, without loss of generality, let t=0 and t=1 correspond to the sampling time instants of the input samples x[n] and x[n+1], respectively. If an output sample y[t] is to be taken between the input samples x[n] and x[n+1], where 0<t<1, then the sample amplitude of y[t] is taken from the quadratic function $$y[t]=at^2+bt+c=0.5f(t)+0.5g(t),$$

where f(t) is a quadratic polynomial function (parabola) passing through the three points (−1, x[n−1]), (0,x[n]), and (1,x[n+1]), and similarly, g(t) is a quadratic polynomial function passing through the three points (0,x[n]), (1,x[n+1]), and (2,x[n+2]).

Such averaging of f(t) and g(t) is beneficial because only three points are needed to define a parabola, and if only f(t) or only g(t) is used calculate y[t], maximal waveform smoothness on either the left side (if using f(t)) or the right side (if using g(t)) would inevitably be favored while sacrificing the waveform smoothness on the other side. By using an average of f(t) and g(t), equal weighting is given to both sides, and the resulting re-sampled output signal is maximally smooth under the constraint of quadratic interpolation.

Under the assumption that the final quadratic polynomial is the average of f(t) and g(t), it can be shown that the quadratic polynomial coefficients a, b, and c can easily be obtained as $$\begin{bmatrix}a\\b\\c\end{bmatrix}\begin{bmatrix}1/4 & -1/4 & -1/4 & 1/4\\-1/4 & -3/4 & 5/4 & -1/4\\0 & 1 & 0 & 0\end{bmatrix}\begin{bmatrix}x[n-1]\\x[n]\\x[n+1]\\x[n+2]\end{bmatrix}.$$

Therefore, when using the averaged quadratic interpolation method to calculate the sample value of an output sample between the input samples x[n] and x[n+1], four neighboring input samples are taken, the 4-dimensional vector is multiplied with the constant 3×4 matrix above to get the final quadratic polynomial coefficients, and then $y[t]=at^2+bt+c$ is used to calculate the output sample value.

The cubic interpolation method is very similar, except that no averaging of polynomials is necessary. Since four points uniquely define a cubic polynomial, and since the time interval between the middle two input samples is at the center of the time span of the four adjacent samples, the resulting cubic polynomial gives equal weight to both sides in terms of waveform smoothness. Therefore, no averaging of two polynomials is necessary.

When interpolating an output sample between x[n] and x[n+1], the cubic interpolation method uses a cubic polynomial function $$y[t]=at^3+bt^2+ct+d$$

to calculate the output sample value, where 0<t<1. It can be shown that the cubic polynomial coefficients can easily be obtained as $$\begin{bmatrix}a\\b\\c\\d\end{bmatrix}\begin{bmatrix}-1/6 & 1/2 & -1/2 & 1/6\\1/2 & -1 & 1/2 & 0\\-1/3 & -1/2 & 1 & -1/6\\0 & 1 & 0 & 0\end{bmatrix}\begin{bmatrix}x[n-1]\\x[n]\\x[n+1]\\x[n+2]\end{bmatrix}.$$

The rest of the procedures are the same as in the averaged quadratic interpolation method.

The averaged quadratic, cubic, and spline interpolation methods may also be used in second stage 104 of FIG. 1. The resulting output signal spectra for the input trumpet signal segment shown in FIG. 11 are shown in FIGS. 19, 20 and 21, respectively for the three interpolation methods above. These three figures should be compared with FIG. 15, where linear interpolation is used in second stage 104.

Comparing FIGS. 19 and 20 with FIG. 15, it can be seen that the spectral image peaks in the 10 kHz to 20 kHz range are about 40 dB below base-band spectral peaks when linear interpolation is used in second-stage of 104 of FIG. 1, but such image peaks are reduced to about 55 dB below base-band peaks when linear interpolation is replaced by averaged quadratic interpolation or cubic interpolation. In FIG. 21, it can be seen that by using spline interpolation in second stage 104, the image distortion in the 10 to 20 kHz range is further reduced to about 65 dB below base-band peaks.

V. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A method for converting a digital audio signal from a first sampling rate to a second sampling rate, comprising:
    upsampling the audio signal by a factor that is unrelated to either the first sampling rate or the second sampling rate to generate an upsampled audio signal; and
    re-sampling the upsampled audio signal at the second sampling rate using interpolation.

2. The method of claim 1, wherein the upsampling comprises upsampling the audio signal by a factor of two.

3. The method of claim 2, wherein the upsampling the audio signal by a factor of two comprises:
    zero padding the audio signal to generate a zero-padded audio signal; and
    lowpass filtering the zero-padded signal.

4. The method of claim 3, wherein the zero padding the audio signal comprises performing 1:2 zero padding of the audio signal and wherein the lowpass filtering the zero-padded signal comprises halfband filtering the zero-padded signal.

5. The method of claim 2, wherein the upsampling the audio signal by a factor of two comprises:

generating first and second samples corresponding to a sample in the audio signal, wherein the first sample is a copy of the audio signal.

6. The method of claim 5, wherein the second sample is determined by multiplying a filter coefficient sequence by an audio signal sequence.

7. The method of claim 5, wherein the second sample is determined based on the equation:

$$x_u[n] = \sum_{k=1,3,5,7} h[k](x_z[n+k] + x_z[n-k])$$

wherein $x_u[n]$ is the second sample corresponding to the audio signal sample, $x_z[n+k]$ and $x_z[n-k]$ are samples from the audio signal, and $h[k]$ are filter coefficients.

8. The method of claim 1, wherein the re-sampling the upsampled audio signal at the second sampling rate using interpolation comprises using at least one of linear interpolation, quadratic interpolation, cubic interpolation, and spline interpolation.

9. The method of claim 1, wherein the first sampling rate is greater than the second sampling rate.

10. The method of claim 1, wherein the second sampling rate is greater than the first sampling rate.

11. The method of claim 1, wherein the upsampling the audio signal to generate an upsampled audio signal comprises performing 1:3 upsampling.

12. The method of claim 1, wherein the upsampling the audio signal to generate an upsampled audio signal comprises using a lowpass filter.

13. The method of claim 12, wherein the lowpass filter comprises a third-band filter.

14. The method of claim 1, wherein the upsampling the audio signal to generate an upsampled audio signal comprises using a bandpass filter.

15. The method of claim 1, wherein the upsampling the audio signal to generate an upsampled audio signal comprises using a filter that substantially eliminates stop-band leakage.

16. A sampling rate converter for converting a digital audio signal from a first sampling rate to a second sampling rate, comprising:
a first stage configured to upsample the audio signal by a factor that is unrelated to either the first sampling rate or the second sampling rate to generate an upsampled audio signal; and
a second stage configured to re-sample the upsampled audio signal at the second sampling rate using interpolation.

17. The sampling rate converter of claim 16, wherein the first stage is configured to upsample the audio signal by a factor of two.

18. The sampling rate converter of claim 17, wherein the first stage is configured to zero pad the audio signal to generate a zero-padded audio signal and to lowpass filter the zero-padded signal.

19. The sampling rate converter of claim 18, wherein the first stage is configured to perform 1:2 zero padding of the audio signal and to lowpass filter the zero-padded signal using a halfband filter.

20. The sampling rate converter of claim 17, wherein the first stage is configured to upsample the audio signal by a factor of two by generating first and second samples corresponding to a sample in the audio signal, wherein the first sample is a copy of the audio signal.

21. The sampling rate converter of claim 20, wherein the first stage generates the second sample by multiplying a filter coefficient sequence by an audio signal sequence.

22. The sampling rate converter of claim 20, wherein the first stage generates the second sample based on the equation:

$$x_u[n] = \sum_{k=1,3,5,7} h[k](x_z[n+k] + x_z[n-k])$$

wherein $x_u[n]$ is the second sample corresponding to the audio signal sample, $x_z[n+k]$ and $x_z[n-k]$ are samples from the audio signal, and $h[k]$ are filter coefficients.

23. The sampling rate converter of claim 16, wherein the second stage is configured to re-sample the upsampled audio signal at the second sampling rate using at least one of linear interpolation, quadratic interpolation, cubic interpolation, and spline interpolation.

24. The sampling rate converter of claim 16, wherein the first sampling rate is greater than the second sampling rate.

25. The sampling rate converter of claim 16, wherein the second sampling rate is greater than the first sampling rate.

26. The sampling rate converter of claim 16, wherein the first stage is configured to generate an upsampled audio signal by performing 1:3 upsampling.

27. The sampling rate converter of claim 16, wherein the first stage is configured to generate an upsampled audio signal using a lowpass filter.

28. The sampling rate converter of claim 27, wherein the lowpass filter comprises a third-band filter.

29. The sampling rate converter of claim 16, wherein the first stage is configured to generate an upsampled audio signal using a bandpass filter.

30. The sampling rate converter of claim 16, wherein the first stage is configured to generate an upsampled audio signal using a filter that substantially eliminates stop-band leakage.

31. A computer program product comprising a computer usable medium having computer readable program code stored therein for causing a computer to convert a digital audio signal from a first sampling rate to a second sampling rate, the computer readable program code comprising:
first computer readable program code for upsampling the audio signal by a factor that is unrelated to either the first sampling rate or the second sampling rate to generate an upsampled audio signal; and
second computer readable program code for re-sampling the upsampled audio signal at the second sampling rate using interpolation.

32. The computer program product of claim 31, wherein the first computer readable program code comprises code for upsampling the audio signal by a factor of two.

33. The computer program product of claim 32, wherein the first computer readable program code further comprises:
code for zero padding the audio signal to generate a zero-padded audio signal; and
code for lowpass filtering the zero-padded signal.

34. The computer program product of claim 33, wherein the code for zero padding the audio signal comprises code for performing 1:2 zero padding of the audio signal and wherein the code for lowpass filtering the zero-padded signal comprises code for halfband filtering the zero-padded signal.

35. The computer program product of claim 32, wherein the code for upsampling the audio signal by a factor of two comprises:
    code for generating first and second samples corresponding to a sample in the audio signal, wherein the first sample is a copy of the audio signal.

36. The computer program product of claim 35, wherein the second sample is determined by multiplying a filter coefficient sequence by an audio signal sequence.

37. The computer program product of claim 35, wherein the second sample is determined based on the equation:

$$x_u[n] = \sum_{k=1,3,5,7} h[k](x_z[n+k] + x_z[n-k])$$

wherein $x_u[n]$ is the second sample corresponding to the audio signal sample, $x_z[n+k]$ and $x_z[n-k]$ are samples from the audio signal, and $h[k]$ are filter coefficients.

38. The computer program product of claim 31, wherein the second computer readable program code comprises code for re-sampling the upsampled audio signal at the second sampling rate using at least one of linear interpolation, quadratic interpolation, cubic interpolation, and spline interpolation.

39. The computer program product of claim 31, wherein the first sampling rate is greater than the second sampling rate.

40. The computer program product of claim 31, wherein the second sampling rate is greater than the first sampling rate.

41. The computer program product of claim 31, wherein the first computer readable program code for upsampling the audio signal comprises code for performing 1:3 upsampling.

42. The computer program product of claim 31, wherein the first computer readable program code for upsampling the audio signal comprises code for lowpass filtering the audio signal.

43. The computer program product of claim 42, wherein the code for lowpass filtering the audio signal comprises code for third-band filtering the audio signal.

44. The computer program product of claim 31, wherein the first computer readable program code for upsampling the audio signal comprises code for bandpass filtering the audio signal.

45. The computer program product of claim 31, wherein the first computer readable program code for upsampling the audio signal comprises code for filtering to substantially eliminate stop-band leakage.

* * * * *

UNITED STATES PATENT AND TRADEMARK OFFICE
CERTIFICATE OF CORRECTION

PATENT NO. : 7,378,995 B2
APPLICATION NO. : 11/586669
DATED : May 27, 2008
INVENTOR(S) : Juin-Hwey Chen It is certified that error appears in the above-identified patent and that said Letters Patent is hereby corrected as shown below:

In the Specification, Column 14,
Line 8, please replace "$=x_u[n]+x^u[n+1]$" with --$=x_u[n]+x_u[n+1]$--.

Signed and Sealed this

Twelfth Day of May, 2009

JOHN DOLL
*Acting Director of the United States Patent and Trademark Office*